ically, US009234947B2

(12) United States Patent
Ogomi et al.

(10) Patent No.: US 9,234,947 B2
(45) Date of Patent: Jan. 12, 2016

(54) MAGNETIC SENSOR DEVICE

(75) Inventors: Tomokazu Ogomi, Chiyoda-ku (JP);
Ryoji Shirahana, Chiyoda-ku (JP);
Toshiaki Shoji, Chiyoda-ku (JP);
Takeshi Musha, Chiyoda-ku (JP); **Jin
Inoue, Chiyoda-ku (JP); Masaaki
Okada**, Chiyoda-ku (JP)

(73) Assignee: Mitsubishi Electric Corporation,
Tokyo (JP)

( * ) Notice: Subject to any disclaimer, the term of this patent is extended or adjusted under 35 U.S.C. 154(b) by 388 days.

(21) Appl. No.: 13/812,680

(22) PCT Filed: Jul. 28, 2011

(86) PCT No.: PCT/JP2011/067367
§ 371 (c)(1),
(2), (4) Date: Jan. 28, 2013

(87) PCT Pub. No.: WO2012/015012
PCT Pub. Date: Feb. 2, 2012

(65) Prior Publication Data
US 2013/0119980 A1  May 16, 2013

(30) Foreign Application Priority Data

Jul. 30, 2010  (JP) ................................. 2010-172367
Nov. 16, 2010  (JP) ................................. 2010-256025
May 16, 2011  (JP) ................................. 2011-109627

(51) Int. Cl.
*G01R 33/09* (2006.01)

(52) U.S. Cl.
CPC .............. *G01R 33/091* (2013.01); *G01R 33/09* (2013.01); *G01R 33/096* (2013.01)

(58) Field of Classification Search
CPC ...... G01R 33/02; G01R 33/09; G01R 33/096; G01R 33/098; G01R 33/093; G07D 7/00; G07D 7/004; G07D 7/02; G07D 7/04; G07D 7/06; H01L 43/02; H01L 43/08
USPC ....................................................... 324/252
See application file for complete search history.

(56) References Cited

U.S. PATENT DOCUMENTS 5,512,822 A * 4/1996 Masuda ................... G07D 7/04
209/569
5,638,222 A * 6/1997 Shigehara ...................... 359/814
(Continued)

FOREIGN PATENT DOCUMENTS

JP          58 2994        1/1983
JP          62 41266       10/1987
(Continued)

OTHER PUBLICATIONS

U.S. Appl. No. 13/813,058, filed Jan. 29, 2013, Musha, et al.
(Continued)

*Primary Examiner* — Melissa Koval
*Assistant Examiner* — Rahul Maini
(74) *Attorney, Agent, or Firm* — Oblon, McClelland, Maier & Neustadt, L.L.P.

(57) ABSTRACT

By providing a first magnet and a second magnet on wall surfaces of a hollow section where paper money is conveyed such that different magnetic poles face each other, a gradient magnetic field is formed wherein both a magnetic field component in an opposing direction to the magnets and a magnetic field component in a conveyance direction of the paper money include a zero point. An AMR element is provided between the paper money and the first magnet. The AMR element is enclosed by a multi-layered substrate and covered with resin. The AMR element is provided in an area where the magnetic field intensity is weak, which is where the magnetic field intensity in the gradient magnetic field in the conveyance direction is near zero. The paper money passes through an area where the magnetic field intensity of the gradient magnetic field is strong.

19 Claims, 31 Drawing Sheets

(56) References Cited

U.S. PATENT DOCUMENTS

| | | | |
|---|---|---|---|
| 5,703,733 A | 12/1997 | Suzuki et al. | |
| 6,310,475 B1 * | 10/2001 | Kawase et al. | 324/235 |
| 6,900,713 B2 * | 5/2005 | Kasashima et al. | 335/207 |
| 6,933,717 B1 * | 8/2005 | Dogaru et al. | 324/239 |
| 7,019,607 B2 * | 3/2006 | Busch | 335/207 |
| 7,591,428 B2 * | 9/2009 | Freeman | G07D 7/04 235/379 |
| 7,821,259 B2 * | 10/2010 | Schanda | G07D 7/04 324/244.1 |
| 8,803,518 B2 * | 8/2014 | Meisenberg | G01R 33/09 324/252 |
| 2007/0186666 A1 * | 8/2007 | Ruehrig et al. | 73/779 |

FOREIGN PATENT DOCUMENTS

| | | |
|---|---|---|
| JP | 5 332703 | 12/1993 |
| JP | 6 167302 | 6/1994 |
| JP | 6 231336 | 8/1994 |
| JP | 7 12908 | 1/1995 |
| JP | 8 86848 | 4/1996 |
| JP | 8 178937 | 7/1996 |
| JP | 8 249602 | 9/1996 |
| JP | 9 152303 | 6/1997 |
| JP | 10 19601 | 1/1998 |
| JP | 10 153454 | 6/1998 |
| JP | 2001 21631 | 1/2001 |
| JP | 2005 129009 | 5/2005 |
| JP | 2008 145379 | 6/2008 |
| WO | 2012 014546 | 2/2012 |

OTHER PUBLICATIONS

International Search Report Issued Nov. 1, 2011 in PCT/JP11/67367 Filed Jul. 28, 2011.

* cited by examiner

FIG. 13
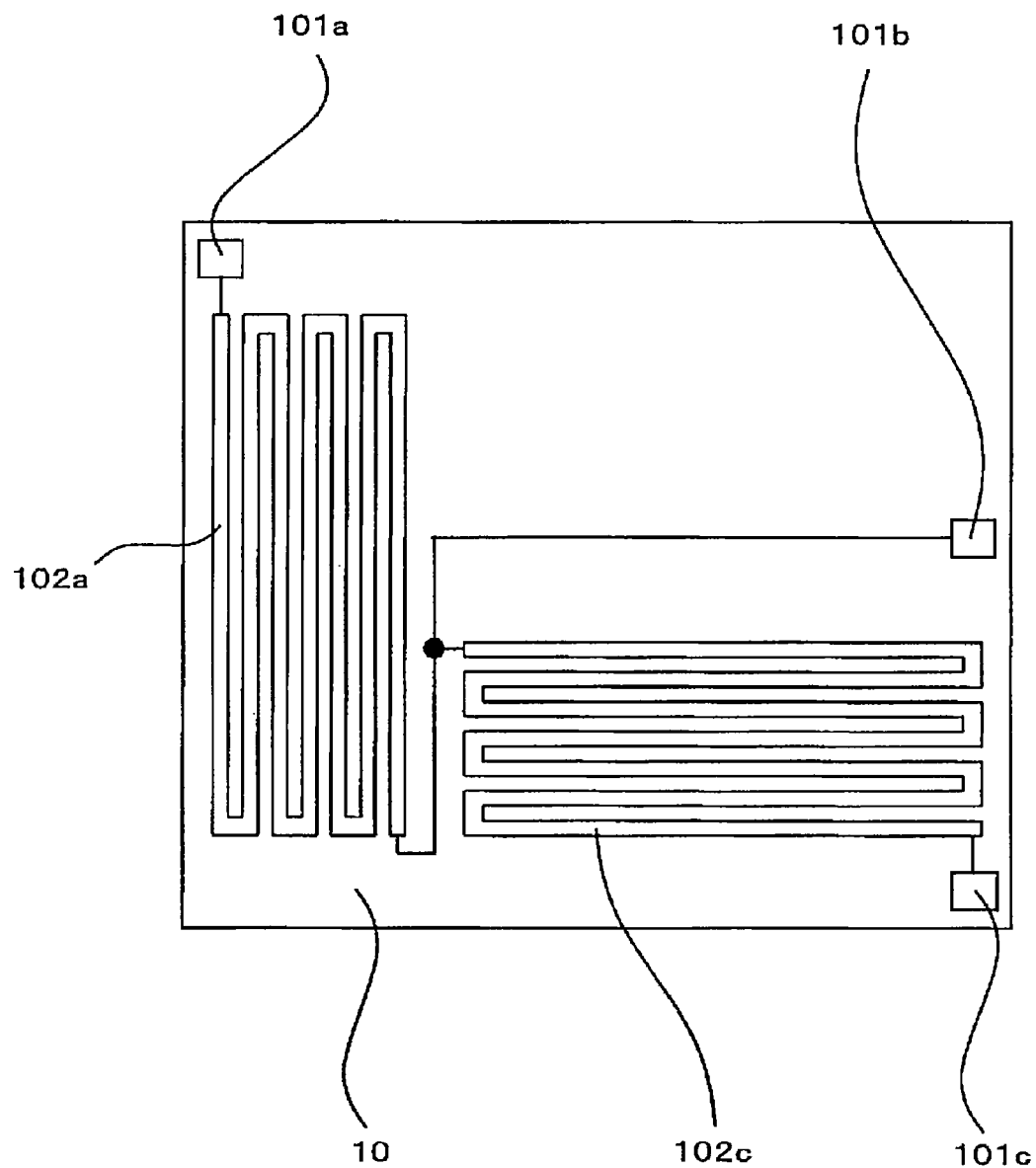
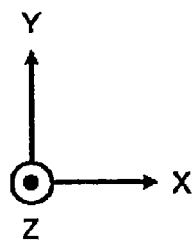

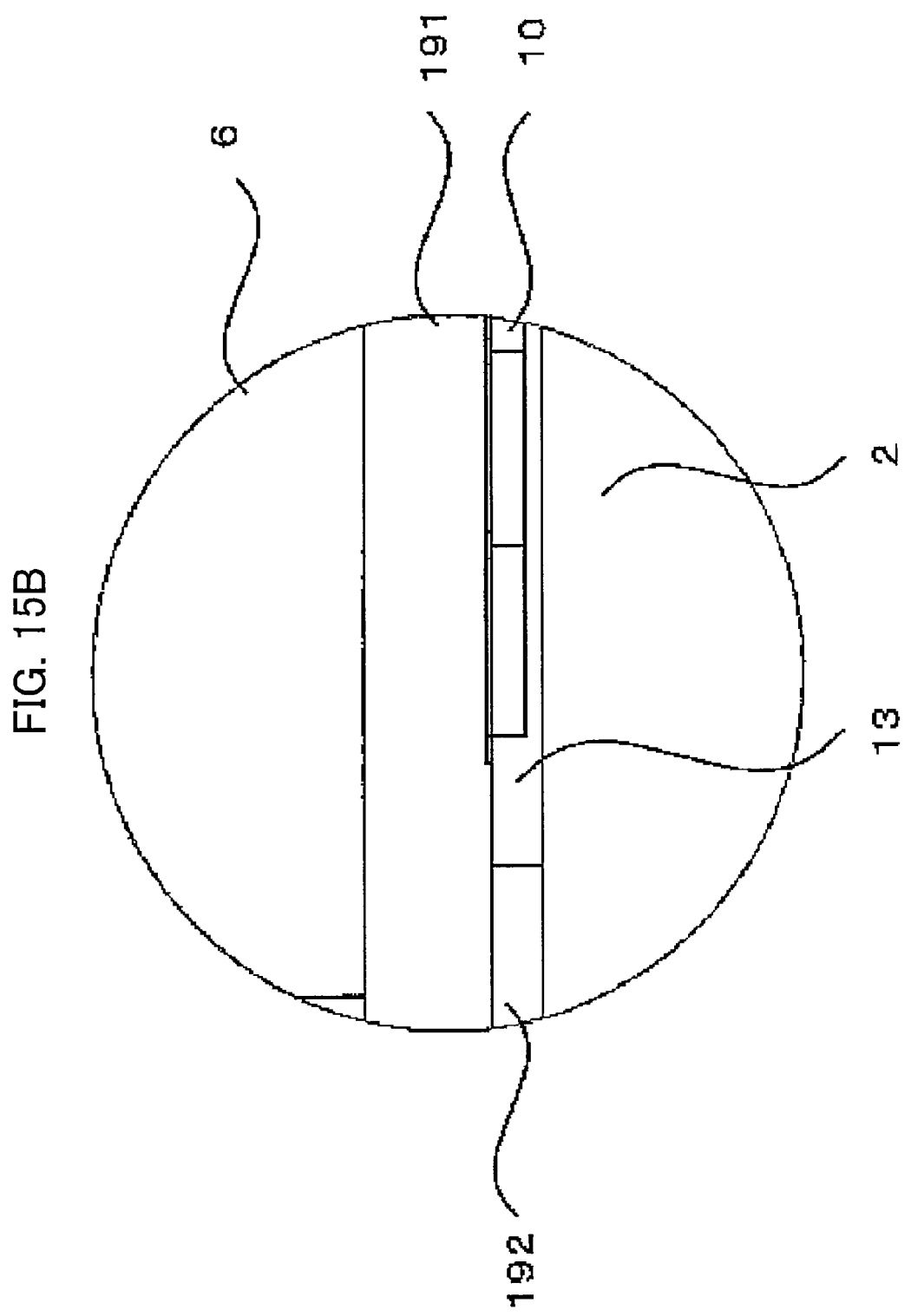

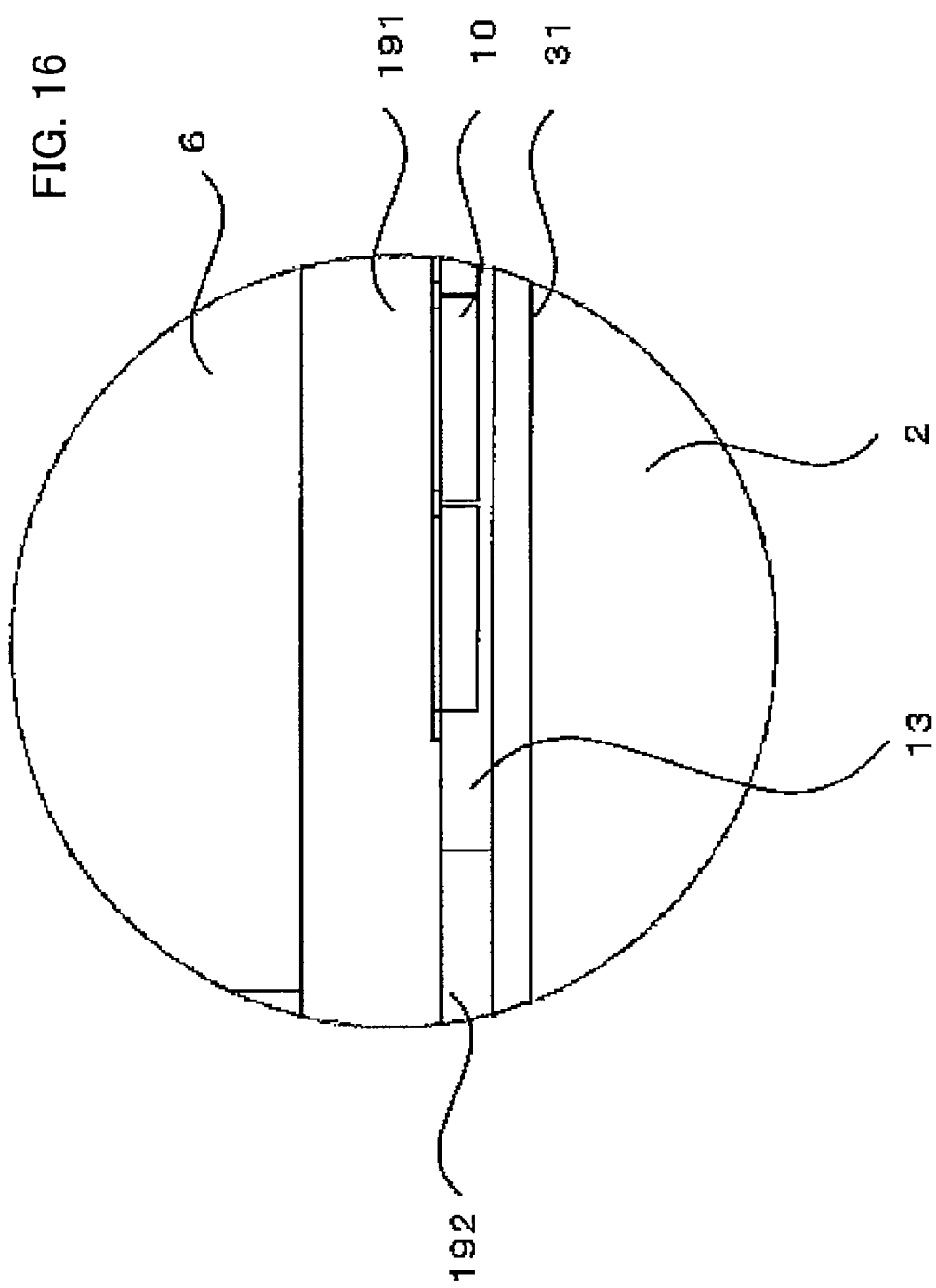

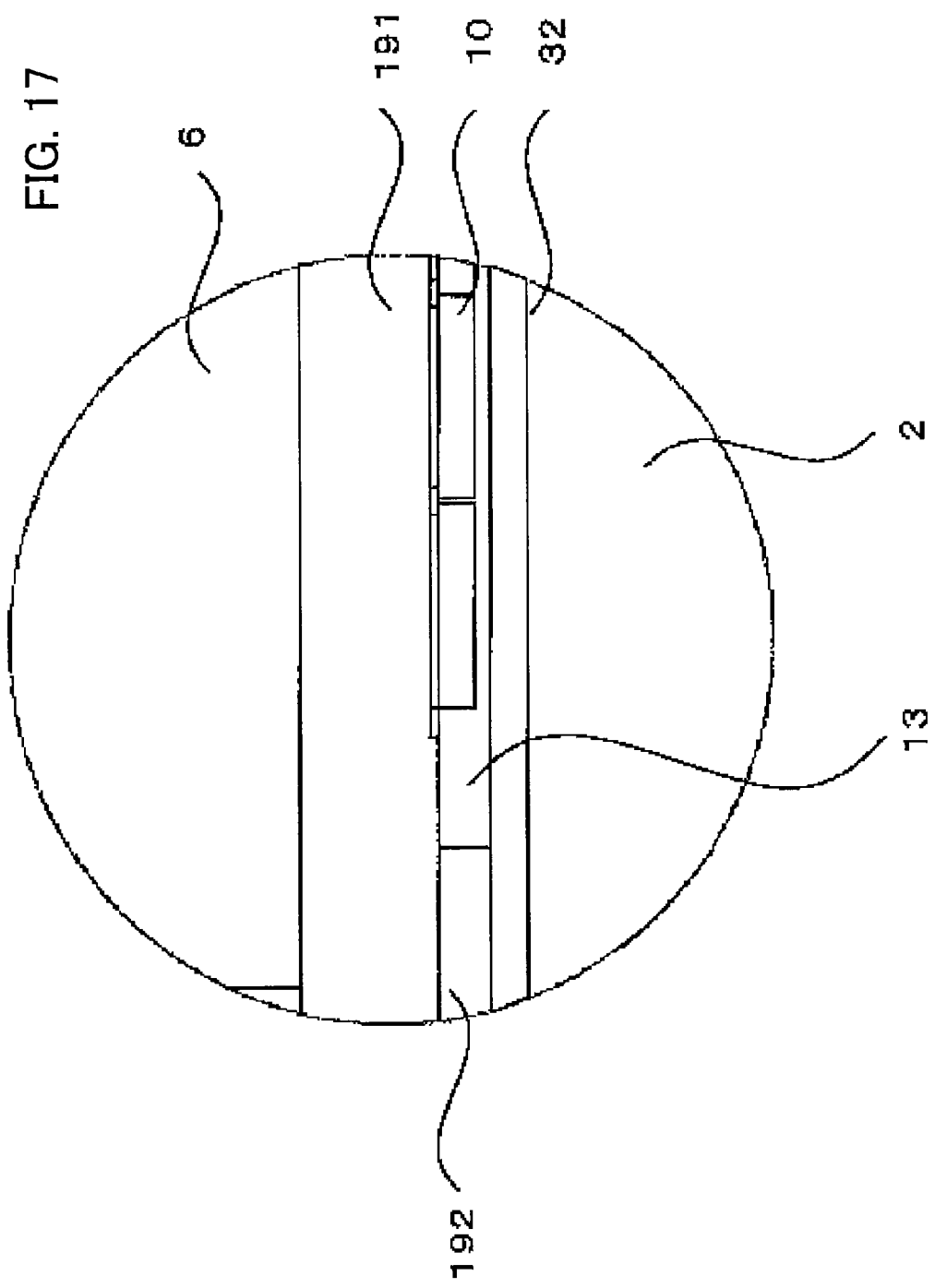

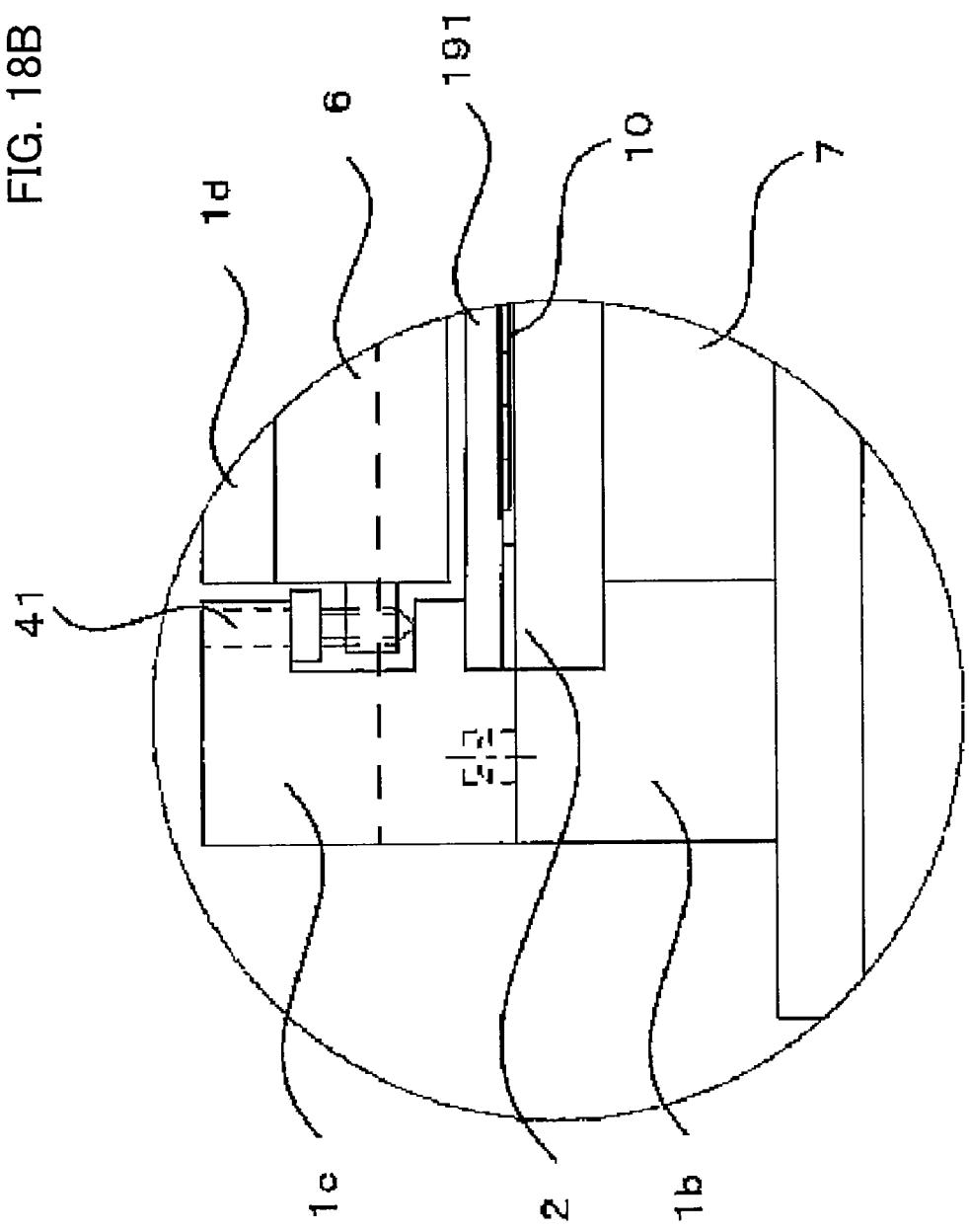

FIG. 20
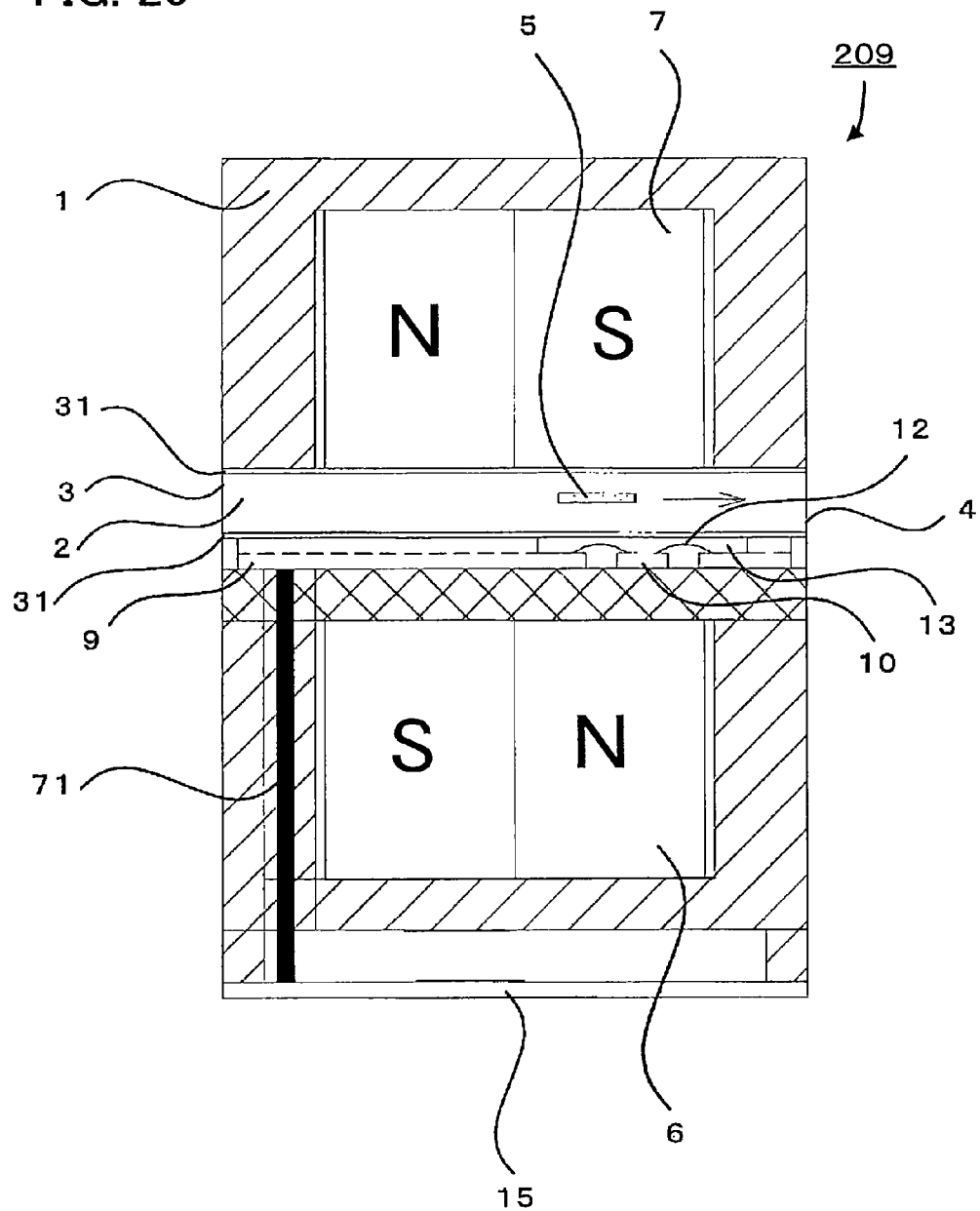
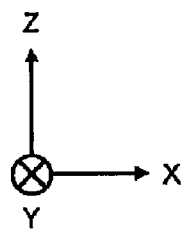

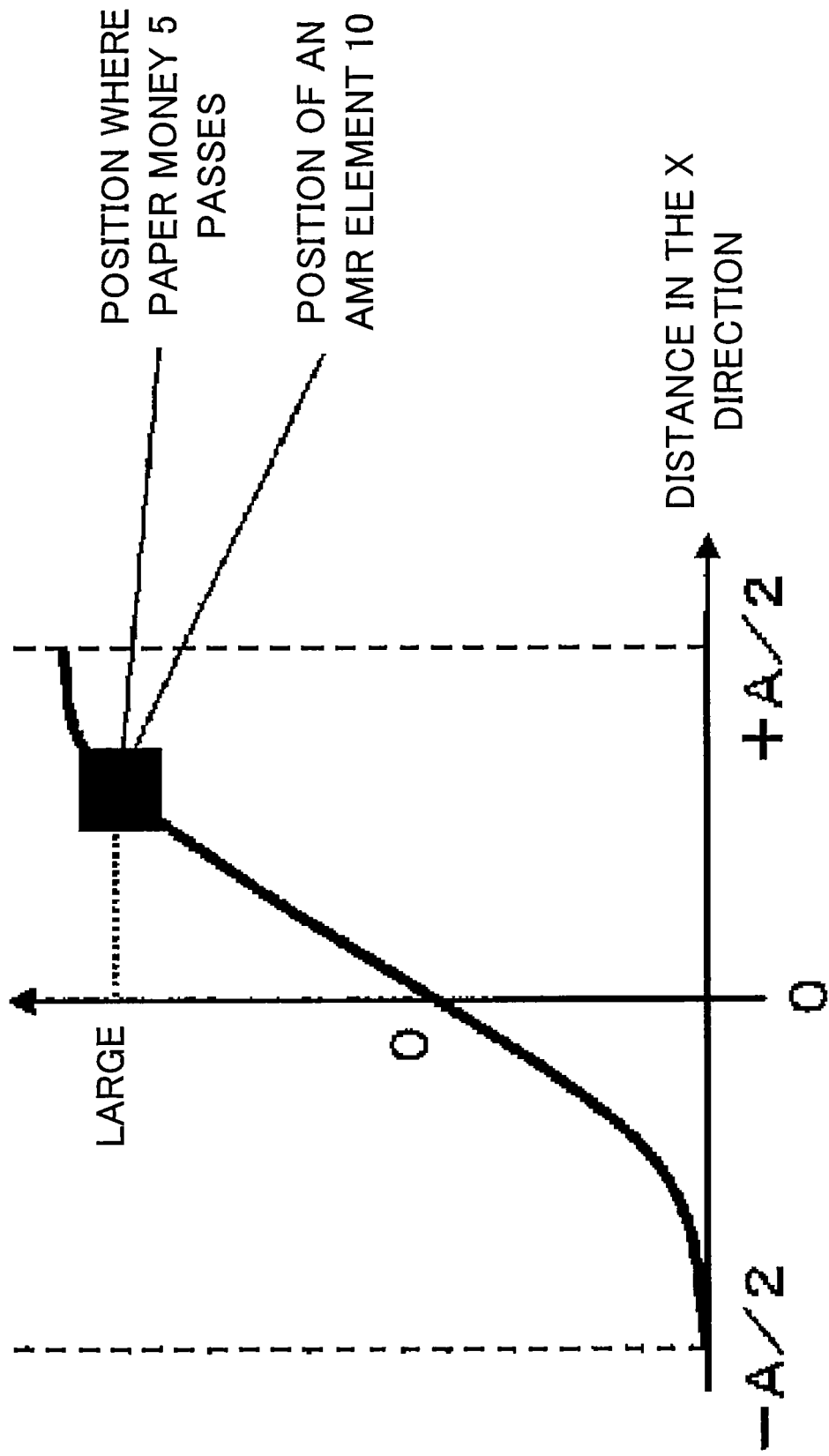

FIG. 23A
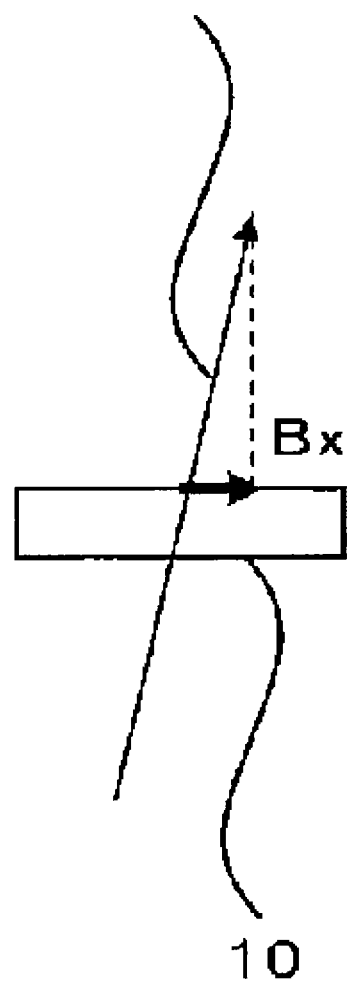
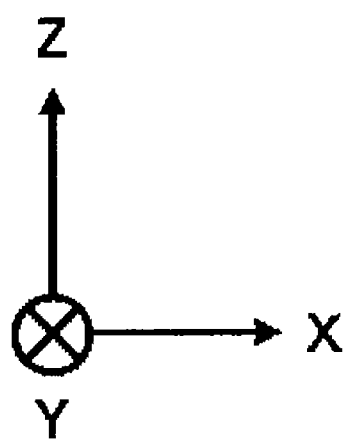

FIG. 23C
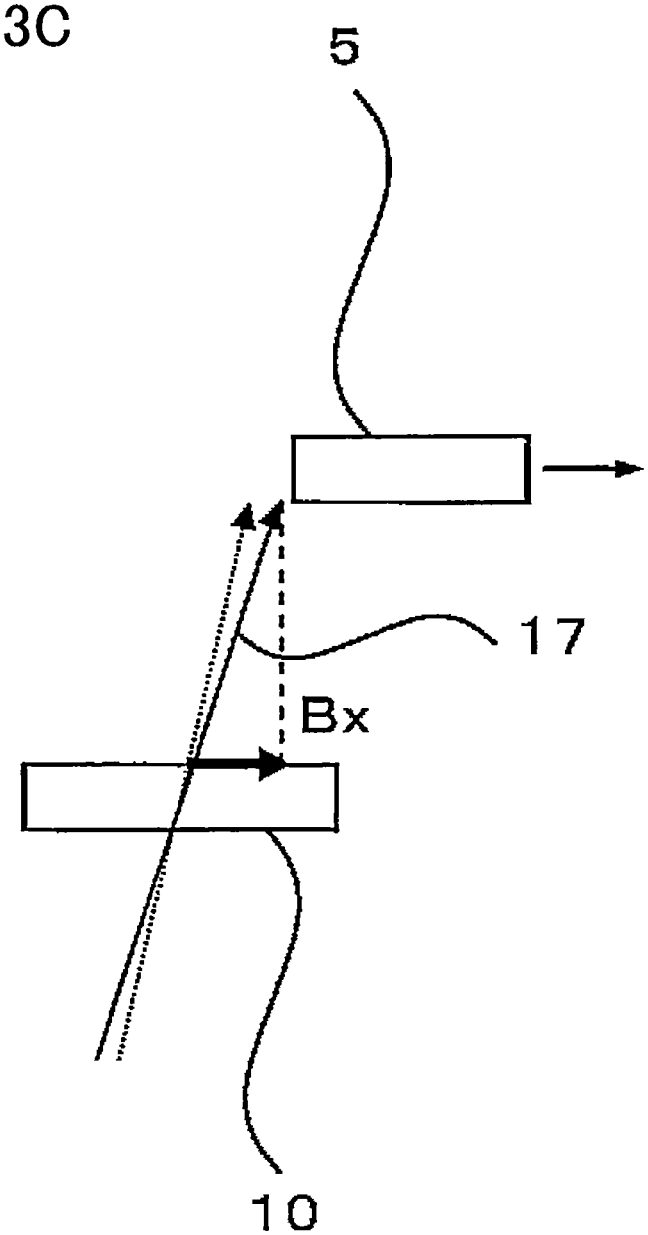
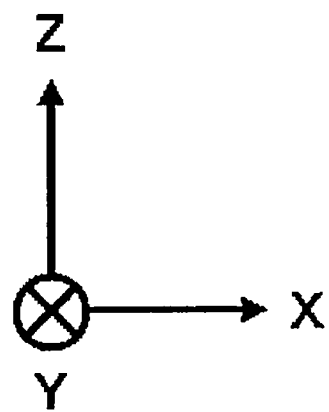

FIG. 24
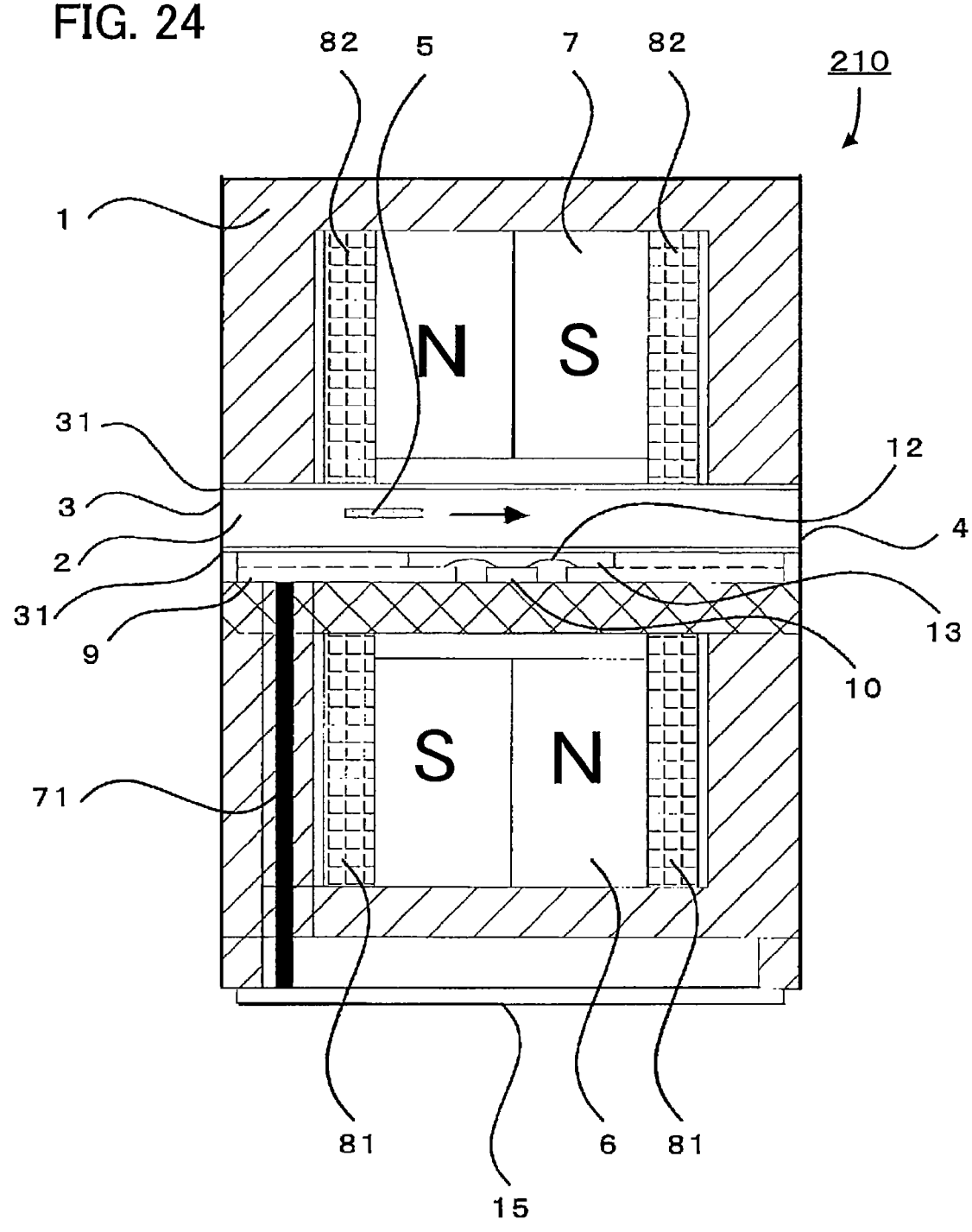
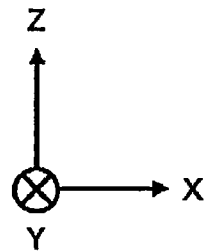

MAGNETIC SENSOR DEVICE

TECHNICAL FIELD

The present invention relates to a magnetic sensor device that detects micro-magnetic patterns that are formed in a test object such as paper money.

BACKGROUND ART

A magnetic sensor device is used for detecting micro-magnetic patterns such as magnetic patterns that are formed in paper money. There are magnetic sensor devices inside which a magnetoresistive element is used, the resistance value of which changes according to the intensity of an applied magnetic field. In a magnetic pattern that is included in a paper-like medium such as a paper money, the remnant magnetization is weak. Therefore, in order to detect a magnetic pattern, it is necessary to provide a magnetoresistive element in environments where the magnetic field is strong, and furthermore, it is necessary to deliver the paper money near the magnetoresistive element.

However, in a non-contact type of magnetic sensor device, the test object and the magnetoresistive element are arranged so as to be in noncontact with each other. Therefore, there is a problem in that the amount of change in the resistance value of the magnetoresistive element is small, and thus the detection sensitivity of the magnetic pattern included in the test object is low. Moreover, in conventional magnetic sensor devices, there is a problem in that the detection sensitivity may vary due to assembly error of the magnetic sensor device or variation in the position where the test object passes.

Patent Literature 1 discloses technology for improving the detection sensitivity of a test object. In the technology disclosed in Patent Literature 1, the magnetic sensor device is composed of two magnetic sensors, with each being provided with a high-potential-side magnetoresistive element and a low-potential-side magnetoresistive element. The two magnetic sensors are such that the one high-potential-side magnetoresistive element faces the other low-potential-side magnetoresistive element, and are connected so as to output inverted signals. The signal that is outputted from each magnetic sensor undergoes differential amplification by an amplifier. As a result, the output signal from each magnetic sensor is such that the in-phase noise component is removed, the signal component is amplified and the S/N ratio is increased.

Moreover, Patent Literature 2 discloses a magnetic sensor device in which, by pressing the test object in contact with and moving the test object over the surface of a protective case, variation in the location where the test object passes is reduced. In this magnetic sensor, in order to expose the leads of the magnetoresistive element chip, an insulator film on which the leads are exposed is used. The exposed leads of the insulator film are connected to the electrodes of the magnetoresistive element chip inside a device hole where the insulating layer on the magnetoresistive element chip surface has been removed. A protective case is provided in order to protect the magnetoresistive element chip and the exposed leads. In order to insulate the magnetoresistive element chip from the protective case, an air gap is formed between the magnetoresistive element chip and the protective case.

PRIOR ART LITERATURE

Patent Literature

Patent Literature 1: Unexamined Japanese Patent Application Kokai Publication No. 2001-21631

Patent Literature 2: Unexamined Japanese Patent Application Kokai

DISCLOSURE OF THE INVENTION

Problems to be Solved by the Invention

However, the magnetic sensor device disclosed in Patent Literature 1 requires two magnetic sensors that are arranged so as to face each other by way of the test object. Moreover, in order to improve the S/N ratio of the signal outputted from the magnetic sensor, and improve the detection sensitivity of the test object, it is necessary for a differential amplifier circuit to perform differential amplification of the output signal from each magnetic sensor. Furthermore, in Patent Literature 1, in order to improve the detection sensitivity in examining the test object, a bias magnet is provided for increasing the intensity of the magnetic field of the conveyance path of the test object; however, the test object passes at a position separated further from the bias magnet than the semiconductor magnetoresistive element. As a result, change in the intensity of the magnetic field due to the test object being small, makes increased output by the magnetic sensor impossible.

In Patent Literature 2, after an insulating layer has been formed over the entire circuitry of the magnetoresistive element chip, special processing must be performed to remove the insulating layer from the magnetoresistive element chip in order to connect the electrodes of the magnetoresistive element chip to the exposed leads. Therefore, the manufacturing process becomes complicated. In addition, by forming an air gap, the distance between the test object that is located on the outside of the magnetic sensor device (outside the protective case) and the magnetoresistive element chip is increased. Therefore, there is a problem in that the detection sensitivity for examining the test object decreases.

Taking into consideration the problems described above, the objective of the present invention is to provide a magnetic sensor that detects a magnetic pattern of a test object with good sensitivity even though the test object having the magnetic pattern is in noncontact with the magnetoresistive element.

Moreover, another objective of the present invention is to provide a non-contact type magnetic sensor device that has high sensitivity.

Means for Solving the Problem

In order to accomplish the objectives above, the magnetic sensor device according to a first aspect of the present invention is provided with:

a housing that includes a first slit, which is an insert opening for a test object, a hollow section, which is a conveyance path for the test object that has been inserted through the first slit, and a second slit, which is an output opening for the test object that was conveyed through the hollow section;

a first magnet that is provided in the hollow section and that is arranged such that the magnetic poles alternate along the conveyance direction of the test object;

a second magnet that is provided in the hollow section in a position that faces the first magnet on an opposite side of the conveyance path, and that by arranging the magnetic poles along the conveyance direction such that magnetic poles that face the magnetic poles of the first magnet differ, forms a gradient magnetic field continuously along the conveyance direction;

a magnetoresistive element that is provided between the test object and the first magnet and that has an output terminal, and is such that the resistance value thereof changes by detecting a magnetic component of the test object that passes through the gradient magnetic field;

a multi-layered substrate that, together with outputting the change in resistance value from the output terminal of the magnetoresistive element to the outside from a pad, encloses the magnetoresistive element;

an electrical connection means for electrically connecting the pad of the multi-layered substrate and the output terminal of the magnetoresistive element; and resin that covers the magnetoresistive element and the electrical connection means; wherein the magnetoresistive element is provided in an area where the magnetic field intensity is weak, which is where the magnetic field intensity in the gradient magnetic field is near zero; and the test object passes through an area where the magnetic field intensity of the gradient magnetic field is stronger than the area of weak magnetic field intensity.

The magnetic sensor device according to a second aspect of the present invention is provided with:

a housing that includes a first slit, which is an insert opening for a test object, a hollow section, which is a conveyance path for the test object that has been inserted through the first slit, and a second slit, which is an output opening for the test object that was conveyed through the hollow section;

a first magnet that is provided in the hollow section and that is arranged such that the magnetic poles alternate along the conveyance direction of the test object;

a second magnet that is provided in the hollow section in a position that faces the first magnet on an opposite side of the conveyance path, and that by arranging the magnetic poles along the conveyance direction such that magnetic poles that face the magnetic poles of the first magnet differ, forms a gradient magnetic field between the second magnet and the first magnet, wherein the magnetic field component in the opposing direction to the first magnet and the magnetic field component in the conveyance direction both include a zero point;

a magnetoresistive element that is provided between the test object and the first magnet and that has an output terminal, and is such that the resistance value thereof changes by detecting a magnetic component of the test object that passes through the gradient magnetic field;

a multi-layered substrate that, together with outputting the change in resistance value from the output terminal of the magnetoresistive element to the outside from a pad, encloses the magnetoresistive element;

an electrical connection means for electrically connecting the pad of the multi-layered substrate and the output terminal of the magnetoresistive element; and resin that covers the magnetoresistive element and the electrical connection means; wherein the magnetoresistive element is provided in an area where the magnetic field intensity is weak, which is where the magnetic field intensity in the conveyance direction of the gradient magnetic field is near zero; and the test object passes through an area where the magnetic field intensity of the gradient magnetic field is stronger than the area of weak magnetic field intensity.

The magnetic sensor device according to a third aspect of the present invention is provided with:

a housing that includes a first slit, which is an insert opening for a test object, a hollow section, which is a conveyance path for the test object that has been inserted through the first slit, and a second slit, which is an output opening for the test object that was conveyed through the hollow section;

a first magnet that is provided in the hollow section and that is arranged such that the magnetic poles alternate along the conveyance direction of the test object;

a second magnet that is provided in the hollow section in a position that faces the first magnet on an opposite side of the conveyance path, and that by arranging the magnetic poles along the conveyance direction such that magnetic poles that face the magnetic poles of the first magnet differ, forms a gradient magnetic field between the second magnet and the first magnet, wherein the magnetic field component in the opposing direction to the first magnet and the magnetic field component in the conveyance direction both include a zero point;

a magnetoresistive element that is provided between the test object and the first magnet and that has an output terminal, and is such that the resistance value thereof changes by detecting a magnetic component of the test object that passes through the gradient magnetic field;

a multi-layered substrate that, together with outputting the change in resistance value from the output terminal of the magnetoresistive element to the outside from a pad, encloses the magnetoresistive element;

an electrical connection means for electrically connecting the pad of the multi-layered substrate and the output terminal of the magnetoresistive element; and resin that covers the magnetoresistive element and the electrical connection means; wherein the magnetoresistive element is provided in an area where, together with the intensity of the magnetic field component in the conveyance direction of the gradient magnetic field being near zero, the intensity of the magnetic field component in the opposing direction of the gradient magnetic field is strong; and the test object passes through an area where the intensity of the magnetic field component in the opposing direction of the gradient magnetic field is strong.

The magnetic sensor device according to a fourth aspect of the present invention is provided with:

a housing that includes a first slit, which is an insert opening for a test object, a hollow section, which is a conveyance path for the test object that has been inserted through the first slit, and a second slit, which is an output opening for the test object that was conveyed through the hollow section;

a first magnet that is provided in the hollow section and that is arranged such that the magnetic poles alternate along the conveyance direction of the test object;

a second magnet that is provided in the hollow section in a position that faces the first magnet on an opposite side of the conveyance path, and that by arranging the magnetic poles along the conveyance direction such that magnetic poles that face the magnetic poles of the first magnet differ, forms a continuous gradient magnetic field in the conveyance direction between the second magnet and the first magnet;

a plurality of magnetoresistive elements that are provided in an array in a direction orthogonal to the conveyance direction between the test object and the first magnet and that have output terminals, and are such that the resistance values thereof change by detecting a magnetic component of the test object that passes through the gradient magnetic field;

a multi-layered substrate that, together with outputting the changes in resistance values from the output terminals of the plurality of magnetoresistive elements to the outside from a plurality of pads, encloses the plurality of magnetoresistive elements all together;

an electrical connection means for electrically connecting the pads of the multi-layered substrate and the output terminals of the magnetoresistive elements; and resin that covers the plurality of magnetoresistive elements and the electrical connection means; wherein the plurality of magnetoresistive elements are provided in an area where the magnetic field intensity is weak, which is where the magnetic field intensity in the gradient magnetic field is near zero; and the test object passes through an area where the magnetic field intensity of the gradient magnetic field is stronger than the area of weak magnetic field intensity.

The magnetic sensor device according to a fifth aspect of the present invention is provided with:

a housing that includes a first slit, which is an insert opening for a test object, a hollow section, which is a conveyance path for the test object that has been inserted through the first slit, and a second slit, which is an output opening for the test object that was conveyed through the hollow section;

a first magnet that is provided in the hollow section and that is arranged such that the magnetic poles alternate along the conveyance direction of the test object;

a second magnet that is provided in the hollow section in a position that faces the first magnet on an opposite side of the conveyance path, and that by arranging the magnetic poles along the conveyance direction such that magnetic poles that face the magnetic poles of the first magnet differ, a forms gradient magnetic field between the second magnet and the first magnet, wherein the magnetic field component in the opposing direction to the first magnet and the magnetic field component in the conveyance direction both include a zero point;

a plurality of magnetoresistive elements that are provided in an array in a direction orthogonal to the conveyance direction between the test object and the first magnet and that have output terminals, and are such that the resistance values thereof change by detecting a magnetic component of the test object that passes through the gradient magnetic field;

a multi-layered substrate that, together with outputting the changes in resistance values from the output terminals of the plurality magnetoresistive elements to the outside from a plurality of pads, encloses the plurality of magnetoresistive elements all together;

an electrical connection means for electrically connecting the pads of the multi-layered substrate and the output terminals of the magnetoresistive elements; and resin that covers the plurality of magnetoresistive elements and the electrical connection means; wherein each of the magnetoresistive elements is provided in an area where, together with the intensity of the magnetic field component in the conveyance direction of the gradient magnetic field being near zero, the intensity of the magnetic field component in the opposing direction of the gradient magnetic field is strong; and the test object passes through an area where the intensity of the magnetic field component in the opposing direction of the gradient magnetic field is strong.

Effects of the Invention

With the present invention, a first magnet and a second magnet are arranged such that different magnetic poles thereof face each other. Therefore, the magnetic field intensity in the conveyance direction of a test object and the magnetic field intensity in the opposing direction to the first magnet and second magnet form a gradient magnetic field that includes a zero point. By passing a test object through an area where the magnetic field intensity of the gradient magnetic field is strong, a magnetic pattern of the test object is detected with good sensitivity even when a magnetoresistive element and the test object are in noncontact with each other.

BRIEF DESCRIPTION OF DRAWINGS

FIG. 13 is a top view of an AMR element having a resistance pattern with a meander shape of a second embodiment;

FIG. 15B is an enlarged drawing illustrating the construction of a line type magnetic sensor device of a fourth embodiment, and illustrates the area A in FIG. 15A;

FIG. 16 is an enlarged drawing illustrating the construction of a line type magnetic sensor device of a fifth embodiment, and illustrates a location corresponding to the area A in FIG. 15A;

FIG. 17 is an enlarged drawing illustrating the construction of a line type magnetic sensor device of a sixth embodiment, and illustrates a location corresponding to the area A in FIG. 15A;

FIG. 18B is an enlarged drawing illustrating the construction of a line type magnetic sensor device of a seventh embodiment, and illustrates the area B in FIG. 18A;

FIG. 20 is a cross-sectional drawing of a magnetic sensor device of a ninth embodiment of the present invention as seen from the conveyance direction of a test object;

FIG. 22B is a graph illustrating the change in intensity of the magnetic field in the X-axis direction and Z-axis direction in FIG. 21, and illustrates the change in intensity in the conveyance direction (X-axis direction) of the magnetic field in the opposing direction (Z-axis direction);

FIG. 23A is a vector diagram of magnetic force lines for explaining the detection principle of the magnetic sensor device of a ninth embodiment;

FIG. 23C is a vector diagram of magnetic force lines for explaining the detection principle of the magnetic sensor device of a ninth embodiment;

FIG. 24 is a cross-sectional drawing of a magnetic sensor device of a tenth embodiment of a present invention as seen from the conveyance direction of the test body (test object);

MODES FOR CARRYING OUT THE INVENTION (Embodiment 1)

Figure 1:
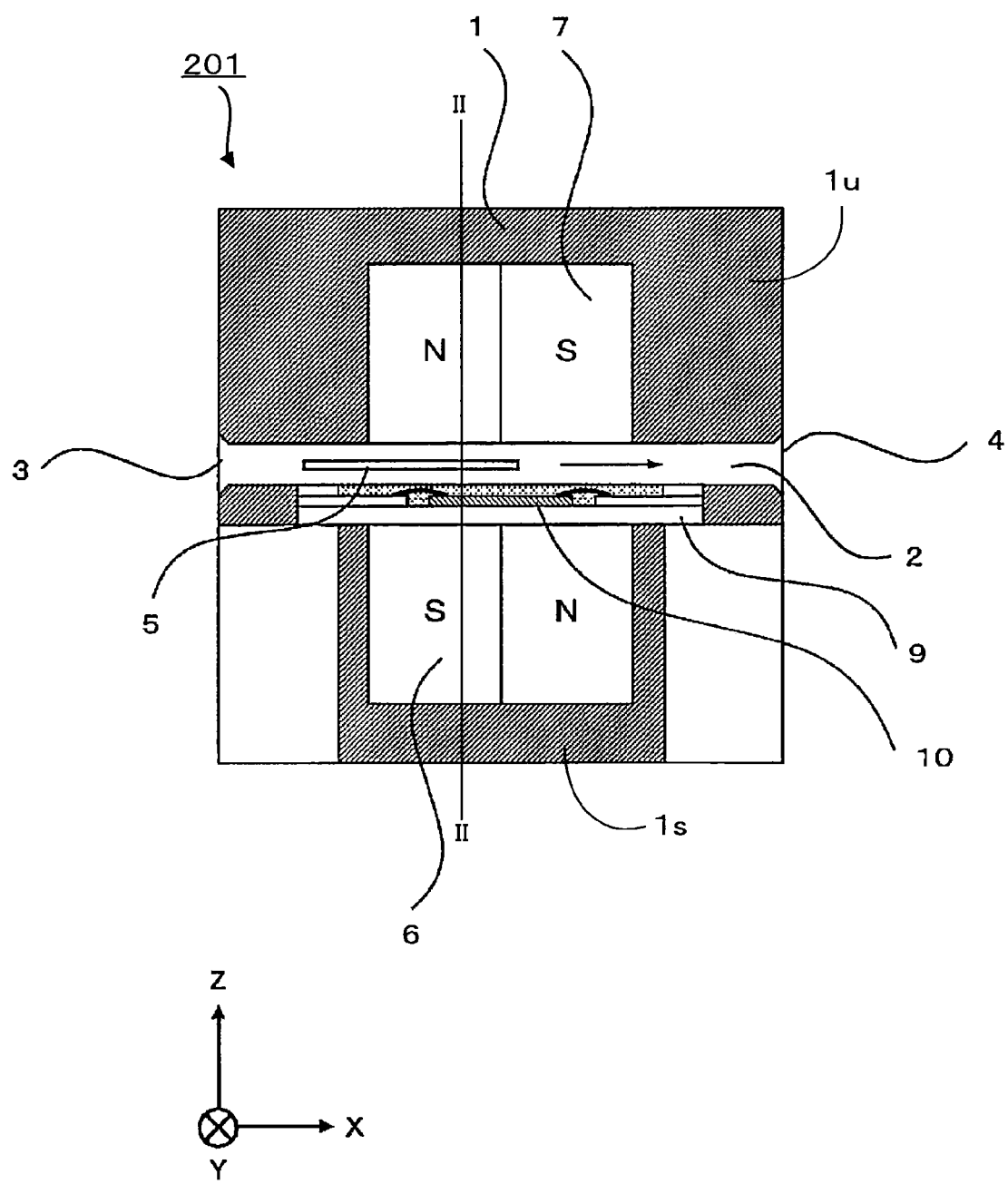
FIG. 1 is a cross-sectional drawing of a magnetic sensor device of a first embodiment of the present invention, and is cut along a vertical plane that is in parallel to the conveyance direction of the test object.
Figure 2:
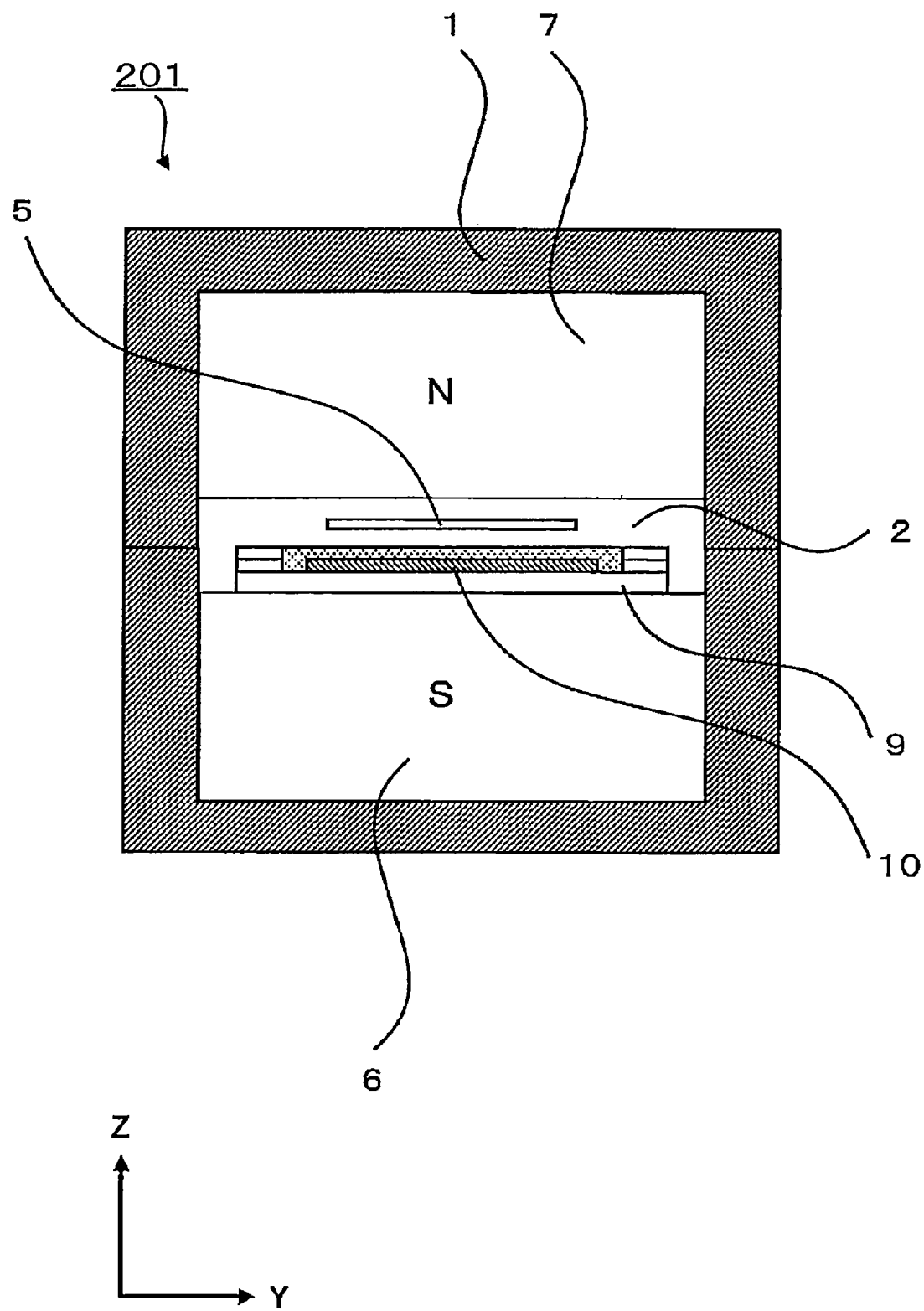
FIG. 2 is a cross-sectional drawing of section II-II of the magnetic sensor device illustrated in FIG. 1.

In the following, a magnetic sensor device 201 of a first embodiment of the present invention is explained with reference to FIG. 1 and FIG. 2. Here, FIG. 1 is a cross-sectional drawing of a magnetic sensor device 201 of a first embodiment of the present invention, and is cut along a vertical plane that is in parallel with the conveyance direction of the test body (test object). FIG. 2 is a cross-sectional drawing of section II-II of the magnetic sensor device 201 illustrated in FIG. 1.

As illustrated in the figures, the magnetic sensor device 201 is provided with a housing 1. The housing 1 is composed of a rectangular upper housing 1u and a rectangular lower housing 1s. The upper housing 1u and the lower housing 1s are constructed, for example, using a magnetic substance.

In the inside of the upper housing 1u a hollow section 2 is formed that functions as a conveyance path for the test object and as a magnet storage section. A first slit 3 that passes through to the hollow section 2 and that is an insertion opening for a test object is formed on one side surface (side wall) of the housing 1. This first slit 3 extends in the reading width direction (direction that is orthogonal to the conveyance direction of the test object). A second slit 4 that passes through to the hollow section 2 and that is an insertion opening for a test object is formed on a side surface (side wall) that faces the one side surface of the housing 1. This second slit 4 extends parallel with the first slit 3. In this embodiment, paper money 5 that is the test body and that includes a magnetic pattern is inserted from the first slit 3, is conveyed through the hollow section 2 as a conveyance path and discharged from the second slit 4.

The lower housing 1s has a container-like shape that is open on the top surface, and supports a multi-layered substrate 9 from underneath.

A first magnet 6 and a second magnet 7 are arranged in the hollow section 2 (hollow section 2 of the upper housing 1u and hollow section 2 of the lower housing 1s) of the housing 1 such that they are separated by a distance from the paper money 5. The first magnet 6 and second magnet 7 are arranged so as to face each other through the conveyance path of the paper money 5.

The first magnet 6 and second magnet 7 are arranged along the conveyance path of the paper money 5 so as to face different magnetic poles. In other words, the first magnet 6 and the second magnet 7 have N poles and S poles that are arranged along the conveyance path of the paper money 5 such that the N pole of the first magnet 6 and the S pole of the second magnet 7 are arranged so as to face each other, and the S pole of the first magnet 6 and the N pole of the second magnet are arranged so as to face each other. As a result, a continuous gradient magnetic field is formed in the conveyance direction between the second magnet 7 and first magnet 6.

A multi-layered substrate 9 is provided on the conveyance path (hollow section 2) side of the first magnet 6 so as to be separated by a distance from the paper money 5. This multi-layered substrate 9 is formed using resin such as glass epoxy. An anisotropic magnetoresistive element (AMR element) 10 is mounted on the multi-layered substrate 9. The AMR element 10 is provided between the paper money 5 (conveyance location of the paper money 5) and the first magnet 6. The AMR element 10 is provided with a resistor on the surface of the substrate. The AMR element 10, by detecting the magnetic component of paper money 5 that passes through the gradient magnetic field, has a characteristic of a changing resistance value. This change in the resistance value occurs due to a change in the magnetic field that is orthogonal to the direction of the electric current that flows through the resistor of the AMR element 10.

Figure 3:
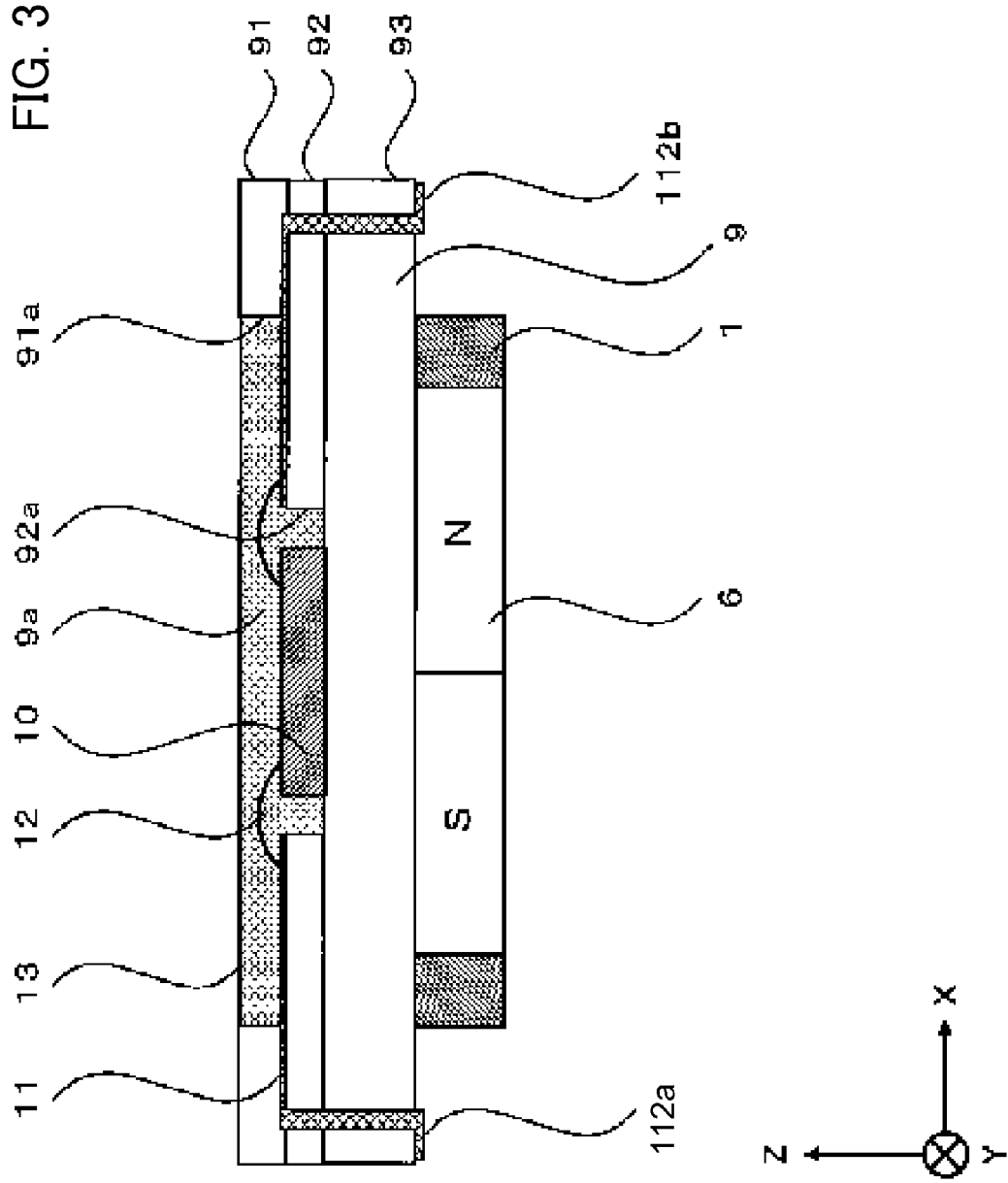
FIG. 3 is an enlarged view illustrating the mounted state of an AMR element on a multi-layered substrate.
Figure 4:
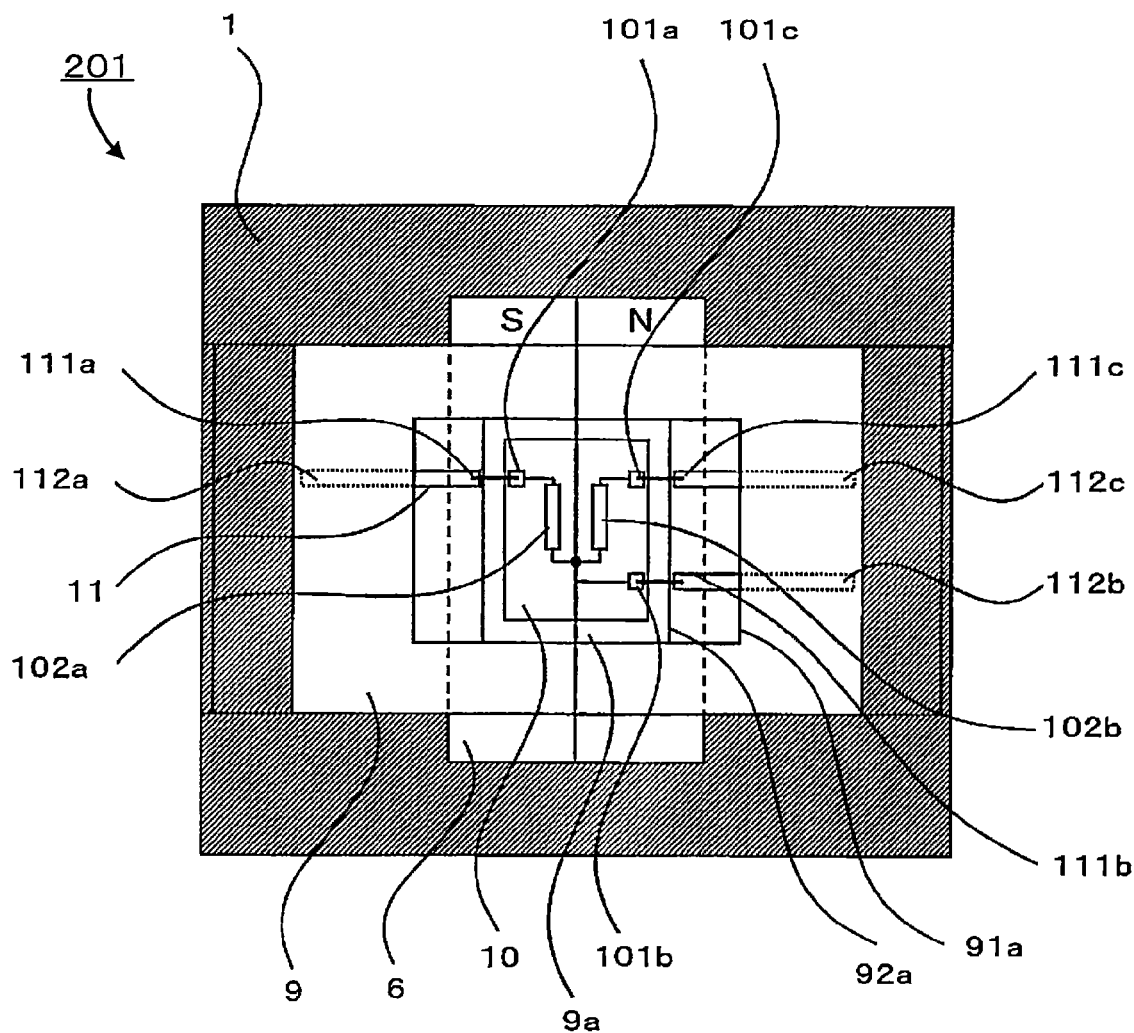
FIG. 4 is a top view illustrating the mounted state of the AMR element when looking at the multi-layered substrate side from the hollow section.

FIG. 3 is an enlarged view illustrating the mounted state of the AMR element 10 on the multi-layered substrate 9. FIG. 4 is a top view illustrating the mounted state of the AMR element 10 when looking at the multi-layer substrate 9 side from the hollow section 2. As illustrated in FIG. 3 and FIG. 4, the multi-layered substrate 9 is composed of a first substrate layer 91, a second substrate layer 92 and a third substrate layer 93. A hole section 9a is formed in the multi-layered substrate 9. The hole section 9a is constructed by a hole section 91a in the first substrate layer 91 connecting with a hole section 92a in the second substrate layer 92. The opening of the hole section 91a is a concave channel that is larger than the opening of the hole section 92a.

The AMR element 10 is fastened with an adhesive to the surface of the third substrate layer 93 that is exposed to the hole section 92a. The AMR element 10 is enclosed in the multi-layered substrate 9. Electrodes 101a to 101c are provided in the AMR element 10. The electrodes 101a to 101c are connected by metal wire 12 to electrodes 111a to 111c. Electrodes 111a to 111c are provided on the surface of the second substrate layer 92 that is exposed to the hole section 91a. The electrodes 111a to 111c are connected to external pads 112a to 112c by way of a transmission line 11. The external pads 112a to 112c are provided on the external rear surface of the multi-layered substrate 9. External circuitry such as a signal processing circuit, bias voltage and the like are connected to the external pads 112a to 112c. The hole section 91a in the first substrate layer 91 and the hole section 92a in the second substrate layer 92 are sealed with resin 13. The resin 13 is filled into the hole section 91a and hole section 92a so as not to go over the surface of the first substrate layer 91. The multi-layered substrate 9 outputs the change in resistance from the output terminals of the AMR element 10 to the outside from the external pads 112a to 112c.

As illustrated in FIG. 4, a resistor pattern 102a and a resistor pattern 102b are arranged adjacent to each other such that the long sides extend in the direction that is orthogonal to the conveyance direction (X-axis direction), or in other words, in the reading width direction (Y-axis direction). The resistor patterns 102a, 102b are both rectangular shaped. The resistor patterns 102a, 102b are arranged parallel with each other such that the long side of the rectangular shape extends in the reading width direction (Y-axis direction). The resistor patterns 102a, 102b are such that one of the end sections of each are connected together in series. The connecting point of this series connection is connected to an electrode 101b, which is the output terminal of the AMR element 10. The other end section of the resistor pattern 102a is connected to the electrode 101a. The other end section of the resistor pattern 102b is connected to the electrode 101c.

Figure 5:
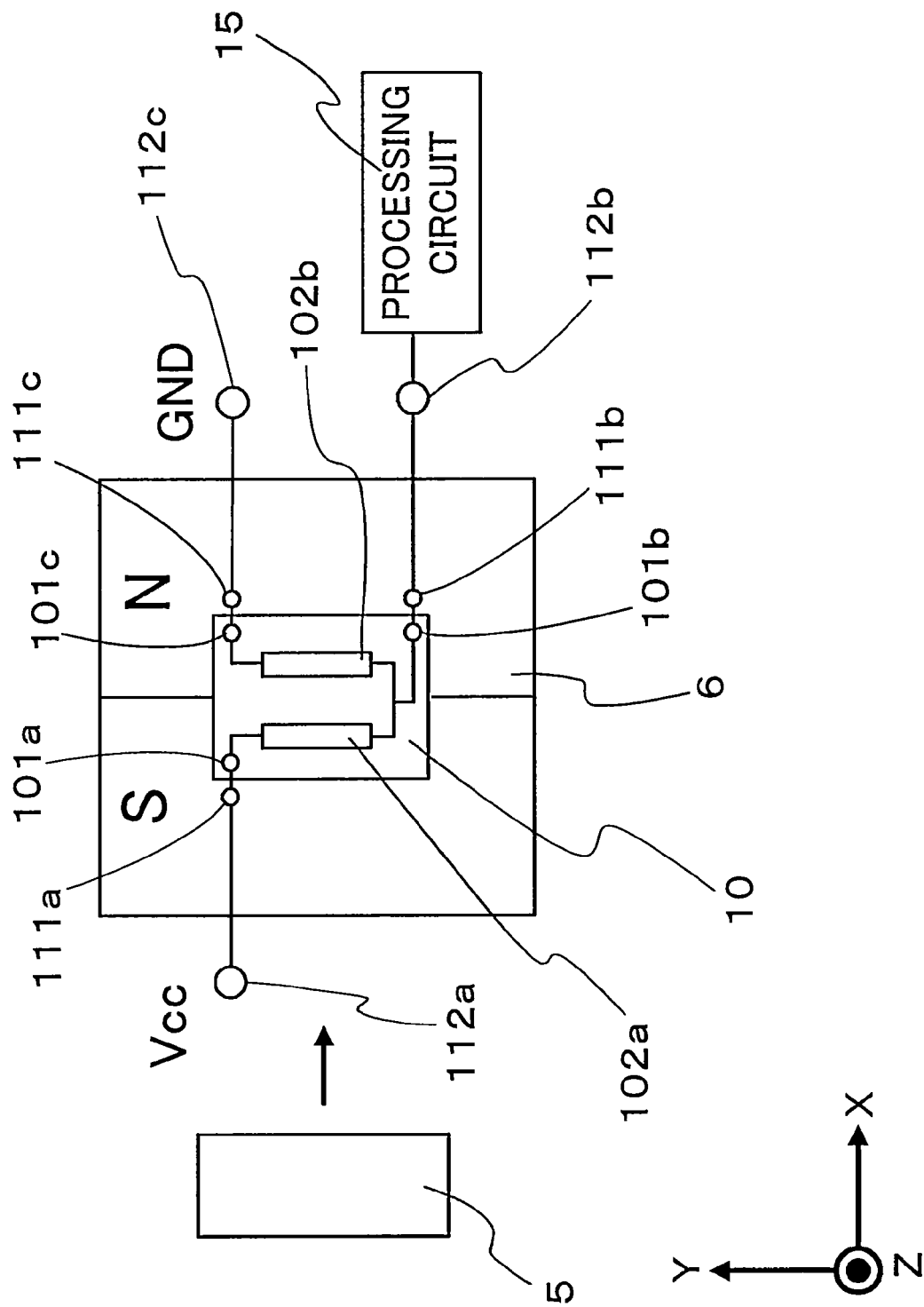
FIG. 5 is a schematic drawing illustrating the connected state between the AMR element of the magnetic sensor device of a first embodiment and the external circuitry.

FIG. 5 is a schematic drawing illustrating the connected state of the AMR element 10 of the magnetic sensor device 201 of this first embodiment of the present invention, and the external circuitry. Electrode 101a is connected to the electrode 111a by metal wire 12 (electrical connection means), and is further connected to a direct-current power-supply voltage Vcc by way of the external pad 112a. The electrode 101b is connected to the electrode 111b by metal wire 12, and is further connected to a processing circuit 15 for signal processing by way of the external pad 112b. The electrode 101c is connected to the electrode 111c by metal wire 12, and is further connected to direct-current ground (GND) by way of the external pad 112c.

Figure 6:
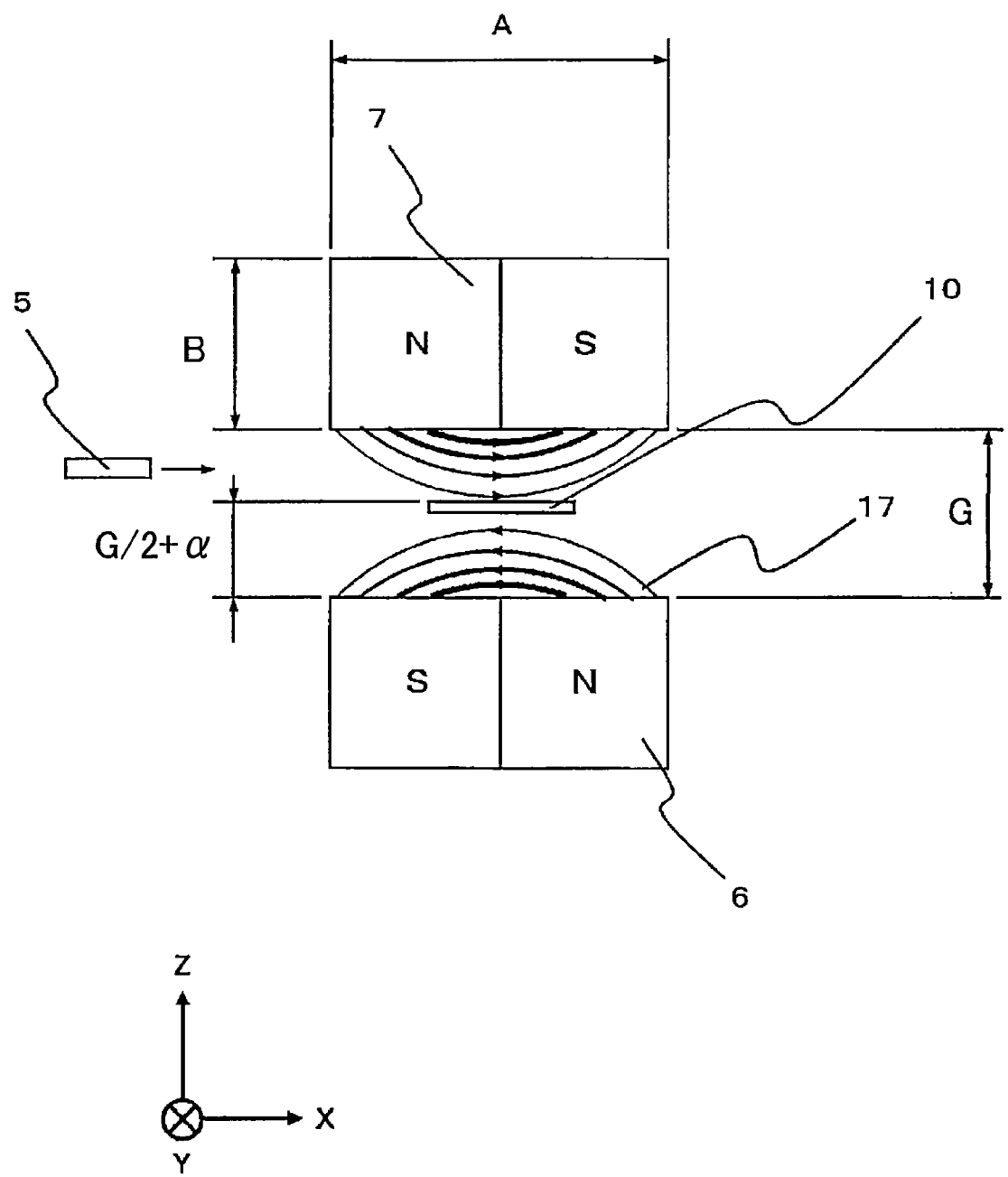
FIG. 6 is a schematic drawing illustrating the magnetic field distribution in the conveyance direction that is generated from a first magnet and a second magnet.
Figure 7:
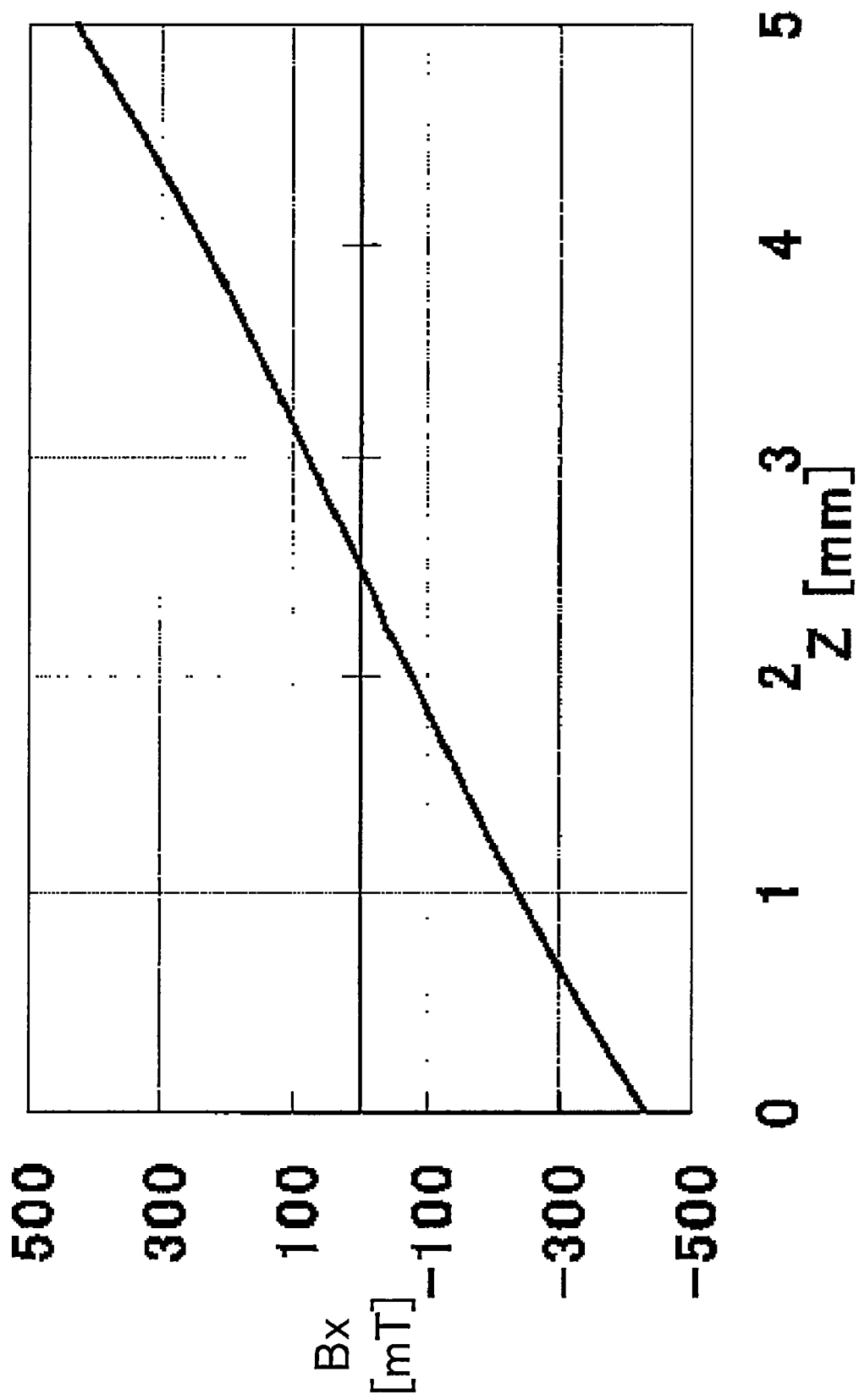
FIG. 7 is a graph illustrating the change in intensity of the magnetic field in the X-axis direction illustrated in FIG. 6 in the direction facing the first magnet and the second magnet.

FIG. 6 is a schematic drawing illustrating the magnetic field distribution in the conveyance direction (X-axis direction) that is generated from the first magnet 6 and second magnet 7. FIG. 7 is a graph illustrating the change in intensity in the opposing direction (Z-axis direction) of the first magnet 6 and second magnet 7 of the magnetic intensity in the X-axis direction illustrated in FIG. 6. From among the components illustrated in FIG. 1, FIG. 6 illustrates the necessary components for explaining the magnetic field distribution and omits the others.

FIG. 6 illustrates the magnetic force lines 17 that are generated by the first magnet 6 and the second magnet 7. The magnetic force lines 17 go from the N pole to the S pole of the first magnet 6, and from the N pole to the S pole of the second magnet 7. The intensity of the magnetic force lines 17 in the opposing direction (Z-axis direction) of the first magnet 6 and second magnet 7 becomes a maximum near the surface of the first magnet 6 and the second magnet 7, and becomes zero at the halfway point in the space G between the first magnet 6 and the second magnet 7.

FIG. 7 is a graph that illustrates the results of calculating the change in intensity in the Z-axis direction of the X-axis direction component of the magnetic intensity in the space G between the first magnet 6 and the second magnet 7. In the graph in FIG. 7, the horizontal axis expresses the distance Z from the first magnet 6. The vertical axis expresses the magnetic field intensity Bx of the X-axis component of the magnetic field above. Calculation of the change in intensity is performed under the conditions of the length A in the conveyance direction of the first magnet 6 and second magnet 7 being 10 mm, the thickness B of the first magnet 6 and the second magnet 7 being 5 mm, the space G being 5 mm, and the material of the first magnet 6 and the second magnet 7 being a neodymium sintered magnet.

As illustrated in the FIG. 7, in the space G, at the halfway point (Z=2.5 mm=G/2), the magnetic intensity Bx of the X-axis direction component is zero and a gradient magnetic field occurs. The AMR element 10 is provided in an area where the magnetic field intensity is weak, which is near zero of the magnetic field intensity Bx of the gradient magnetic field.

Figure 8:
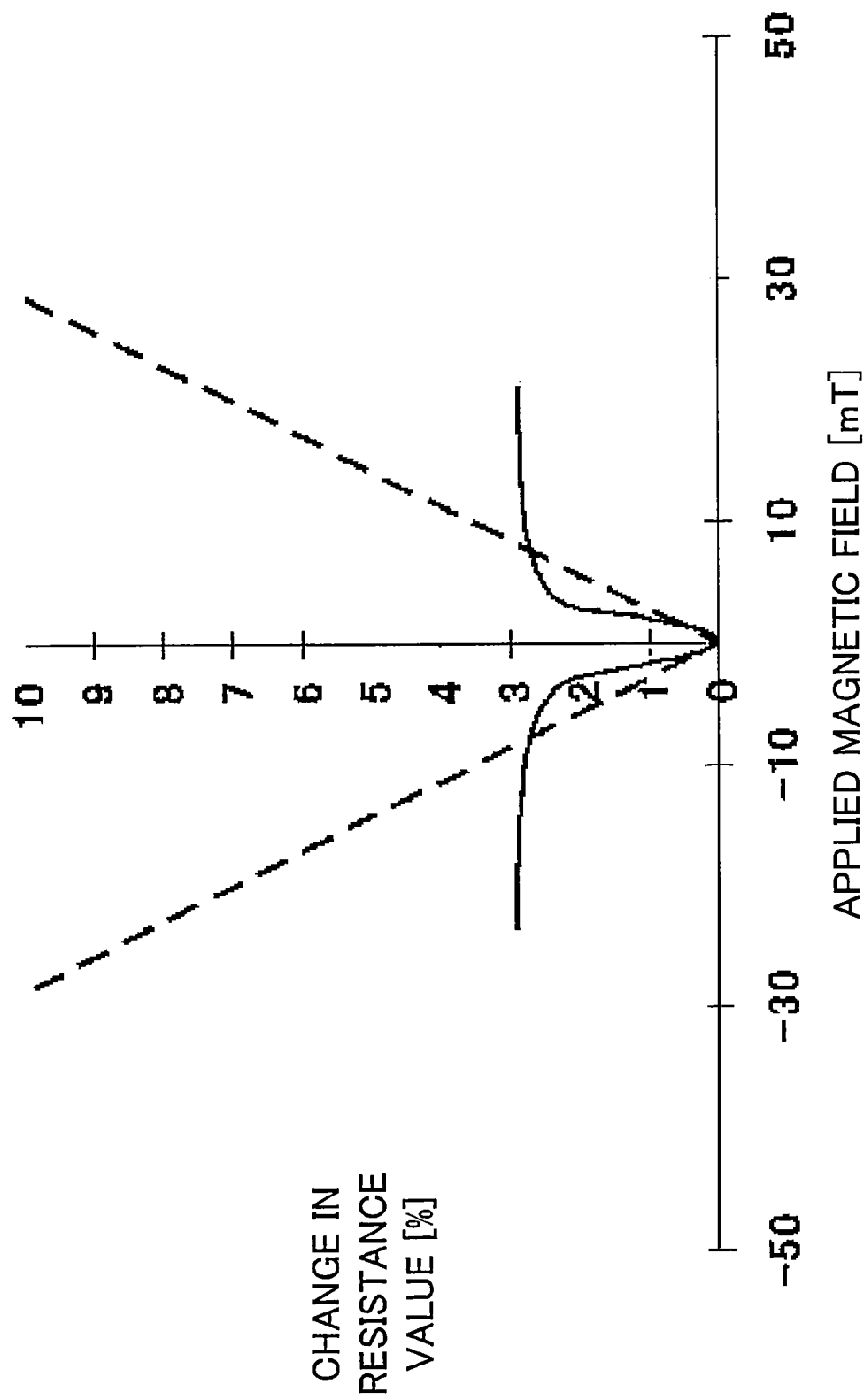
FIG. 8 is a graph illustrating the relationship between the magnetic field that is applied to the AMR element and the rate of change in the resistance of the AMR element.

FIG. 8 is a graph illustrating the relationship between the magnetic field that is applied to the AMR element 10 and the rate of change in the resistance of the AMR element 10. For example, as illustrated in FIG. 7, in conditions where the magnetic field intensity Bx near the Z=2.55 mm is 5 mT, as illustrated in FIG. 8, when an AMR element 10 is used such that the saturated magnetic field is 5 mT, the AMR element 10 is provided in the area of weak magnetic field intensity that is separated by about Z=2.5 to 2.55 mm from the first magnet 6. As a result, a suitable bias magnetic field whose output does not saturate is applied to the AMR element 10. Most preferably, the AMR element 10 is located in a position that is separated by Z=2.52 mm from the first magnet 6. By doing so, a bias magnetic field having a magnetic field intensity Bx=2.5 mT is applied to the AMR element 10. Therefore, the sensitivity slope of the AMR element 10 becomes a maximum, and the output of the AMR element 10 becomes a maximum.

Moreover, in this first embodiment, the position where the paper money 5 passes is set so that a larger magnetic field is applied to the paper money 5 than the AMR element 10. The reason for this, and the position where the paper money 5 passes will be explained in detail below.

When the paper money 5 is conveyed in the X-axis direction with a bias magnetic field applied to the AMR element 10, first, by the magnetic pattern of the paper money 5 being suspended above the resistor pattern 102a, the magnetic field Bx near the resistor pattern 102a changes. On the other hand, the magnetic field Bx near the resistor pattern 102b does not change. Therefore, only the resistance value of the resistor pattern 102a changes, and the electric potential of the electrode 101b changes.

After that, the paper money 5 is further conveyed in the X-axis direction, and when the magnetic pattern of the paper money 5 is above both of the resistor patterns 102a, 102b, the resistance values of the resistor patterns 102a, 102b both change. Therefore, the electric potential of the electrode 101b becomes the same as the electric potential when the paper money 5 is not inside the hollow section 2.

The paper money 5 is further conveyed, and when the magnetic pattern of the paper money 5 is above just the resistor pattern 102b, only the resistance value of the resistor pattern 102b changes. Therefore, the electric potential of the electrode 101b changes in the opposite direction as described above. As a result, the AMR element 10 detects the edge of the magnetic pattern of the paper money.

The change in the magnetic field when the paper money 5 is above the resistor patterns 102a, 102b is proportional to the magnetic field around the paper money 5 (magnetic field applied to the paper money 5), and this change in magnetic field is detected by the AMR element 10. From this, in order to be able to increase the output of the AMR element 10, it is necessary to apply a larger magnetic field to the paper money 5 than to the AMR element 10. Therefore, in this first embodiment, the position where the paper money 5 passes is set in an area where the magnetic field intensity is greater than the area of the weak magnetic field intensity where the AMR element 10 is provided.

When the position where the paper money 5 passes is near Z=3 mm, as illustrated in FIG. 7, the magnetic field that is applied to the paper money 5 is approximately 77 mT. When the distance between the paper money 5 and the AMR element 10 is further increased and the position where the paper money 5 passes is near Z=4 mm, as illustrated in FIG. 7, the magnetic field that is applied to the paper money 5 is approximately 240 mT. In other words, when the AMR element 10 and the paper money 5 are separated, and the position where the paper money 5 passes is changed from Z=3 mm to Z=4 mm, a magnetic field that is nearly three times greater is applied to the paper money 5, so even though the AMR element 10 and the paper money 5 are in noncontact with each other, the magnetic pattern of the paper money 5 is detected with good precision.

Moreover, when the position where the paper money 5 passes is set near Z=4 mm with the AMR element 10 provided at a position of Z=2.5 to 2.55, the space between the AMR element 10 and the paper money 5 is about 1.5 mm. Therefore, there is no contact between the AMR element 10 and the paper money 5. As a result, the AMR element 10 is protected.

When the position where the paper money 5 passes is set near Z=4 mm and the AMR element 10 is provided at a position of Z=2.5 to 2.55, the magnetic detection device 201 is manufactured as described below.

The thickness of the AMR element 10 is typically about 0.5 mm, and in order to position the resistor patterns 102*a*, 102*b* at a point Z=2.52 mm, the thickness of the third substrate layer 93 is set to 2.02 mm.

The thickness of the second substrate layer 92 is set to 0.5 mm, which is the same as the thickness of the AMR element 10. By doing so, it is possible to keep the loop height of the metal wire 12 that connects the electrodes 111*a* to 111*c* of the second substrate layer 92 and the electrodes 101*a* to 101*c* of the AMR element 10 at a minimum.

The thickness of the first substrate layer 91 is set at 0.33 mm, which is about the same as the loop height of the metal wire 12. By filling epoxy type resin 13 having a low viscosity into the hole section 91*a* of the first substrate layer 91 and the hole section 92*a* of the second substrate layer 92 so that the resin 13 does not protrude from the surface of the first substrate layer 91, this resin 13 protects the AMR element 10 and the metal wire 12. Moreover, there are no protrusions to obstruct the conveyance of the paper money 5, and the space between the surface of the multi-layered substrate 9 and the paper money 5 is stably maintained at about 1.2 mm.

With this first embodiment, by passing the paper money 5 through an area where the gradient magnetic field has weak magnetic field intensity, the magnetic pattern of the paper money 5 can be detected with good sensitivity even when the AMR element 10 and the paper money 5 are in noncontact with each other.

Moreover, by mounting the AMR element 10 in the concave shaped hole section 9*a* of the multi-layered substrate 9, and filling the hole section 9*a* with resin 13, the AMR element 10 is protected. By filling the resin 13 so as not to protrude from the surface of the first substrate layer 91, a conveyance path for the paper money 5 that has no protruding sections is obtained.

Figure 9:
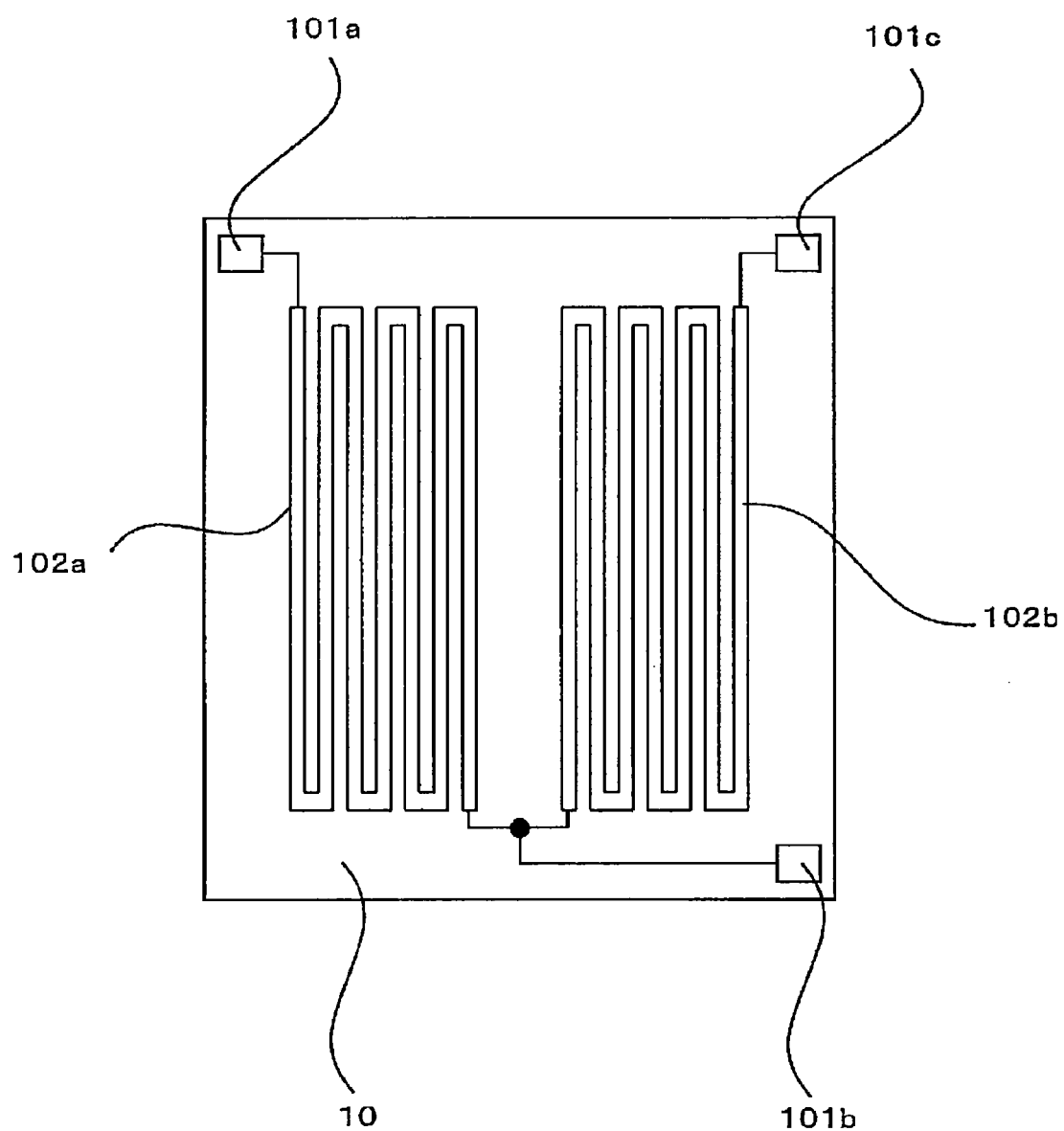
FIG. 9 is a top view of an AMR element having a resistance pattern with a meander shape of a first embodiment.

In this first embodiment, the resistor patterns 102*a*, 102*b* of the AMR element 10 are rectangular shaped; however, as illustrated in FIG. 9, they can also be a meandering shape such that the long side extends in the reading width direction (Y-axis direction). By doing so, the resistance values of the resistor patterns 102*a*, 102*b* can be increased when compared with the rectangular shaped resister patterns 102*a*, 102*b*. Therefore, the detection sensitivity for detecting change in the magnetic field of the AMR element 10 is improved, and the detection sensitivity of the magnetic sensor device 201 is increased.

Figure 10:
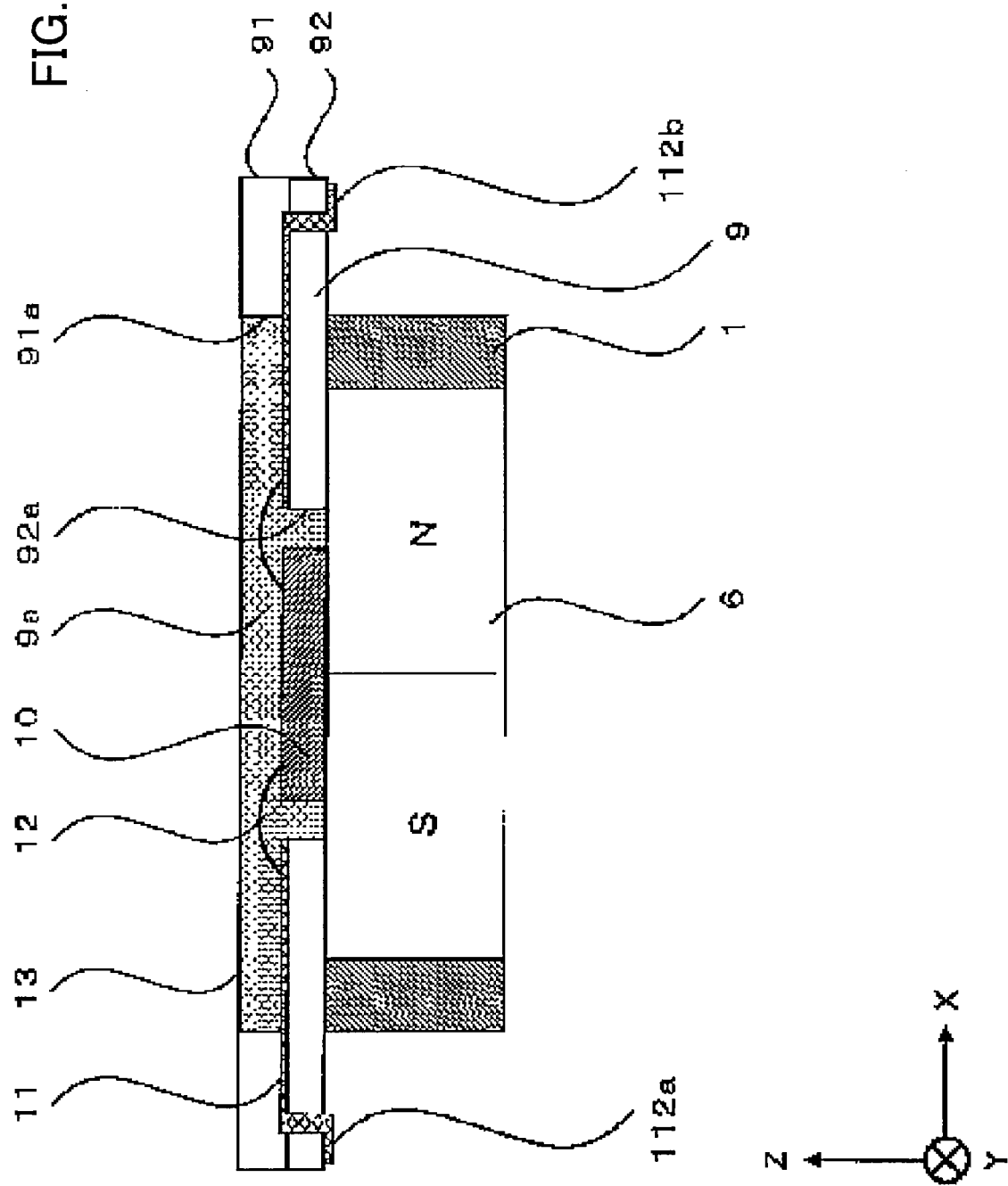
FIG. 10 is an enlarged view illustrating the mounted state of an AMR element adhered to the surface of a first magnet.

Moreover, in this first embodiment, the AMR element 10 was adhered to the surface of the third substrate layer 93 of the multi-layered substrate 9; however, in the case of a rate of change in resistance or a saturated magnetic field intensity of the AMR element 10 that is different than in the first embodiment, and when the AMR element is close to the first magnet 6, then as illustrated in FIG. 10, the hole section 9*a* of the multi-layered substrate 9 can have through hole construction (construction wherein the surface of the first magnet 6 is exposed), and the AMR element 10 can be adhered to the surface of the conveyance path (hollow section 2) side of the first magnet 6.

Furthermore, in this first embodiment, an AMR element 10 was used as the magnetoresistive element; however, it is also possible to use a giant magnetoresistive effect (GMR) element, or a tunnel magnetoresistive effect (TMR) element instead.

(Embodiment 2)

Figure 11:
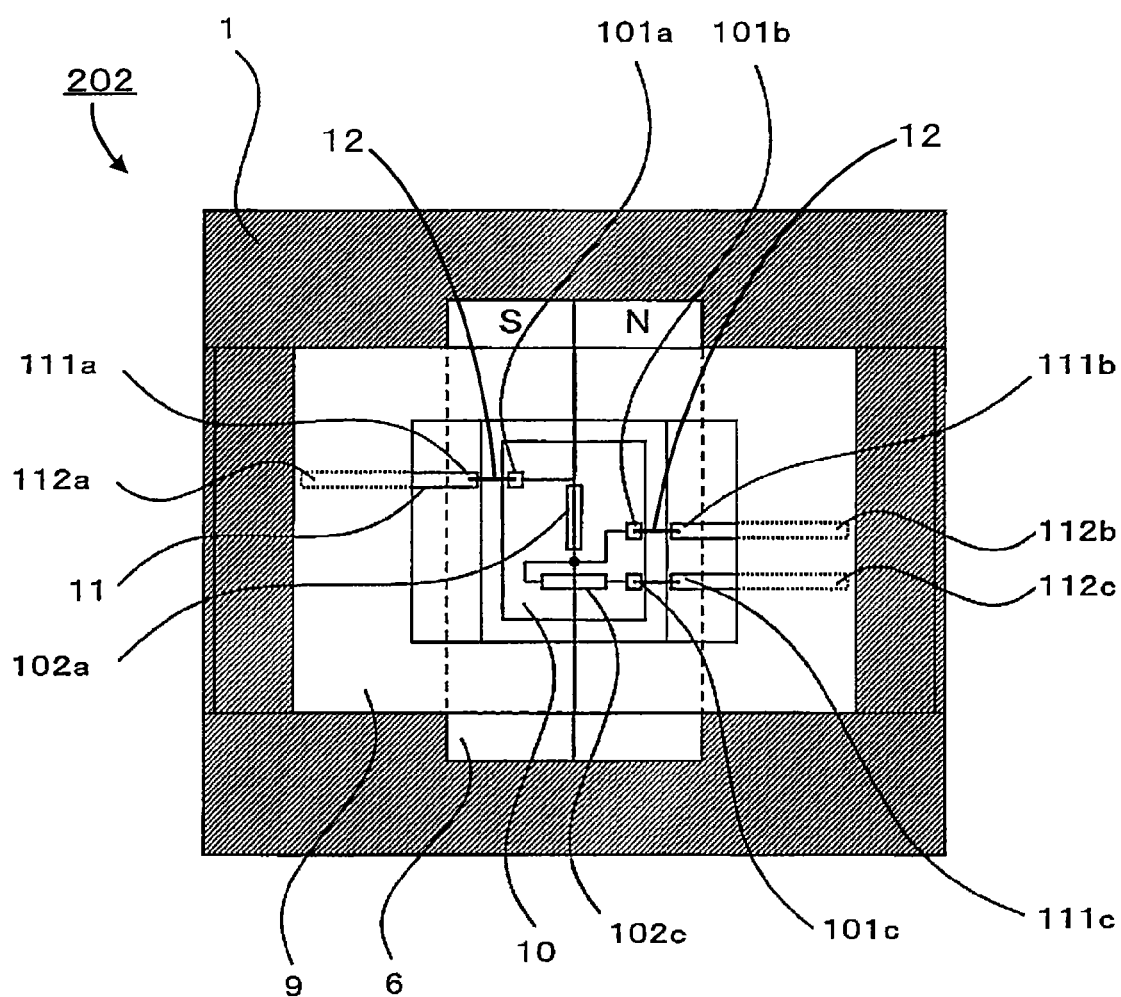
FIG. 11 is a top view illustrating the mounted state of an AMR element of a magnetic sensor device of a second embodiment of the present invention when looking at the side of the multi-layered substrate from the hollow section.
Figure 12:
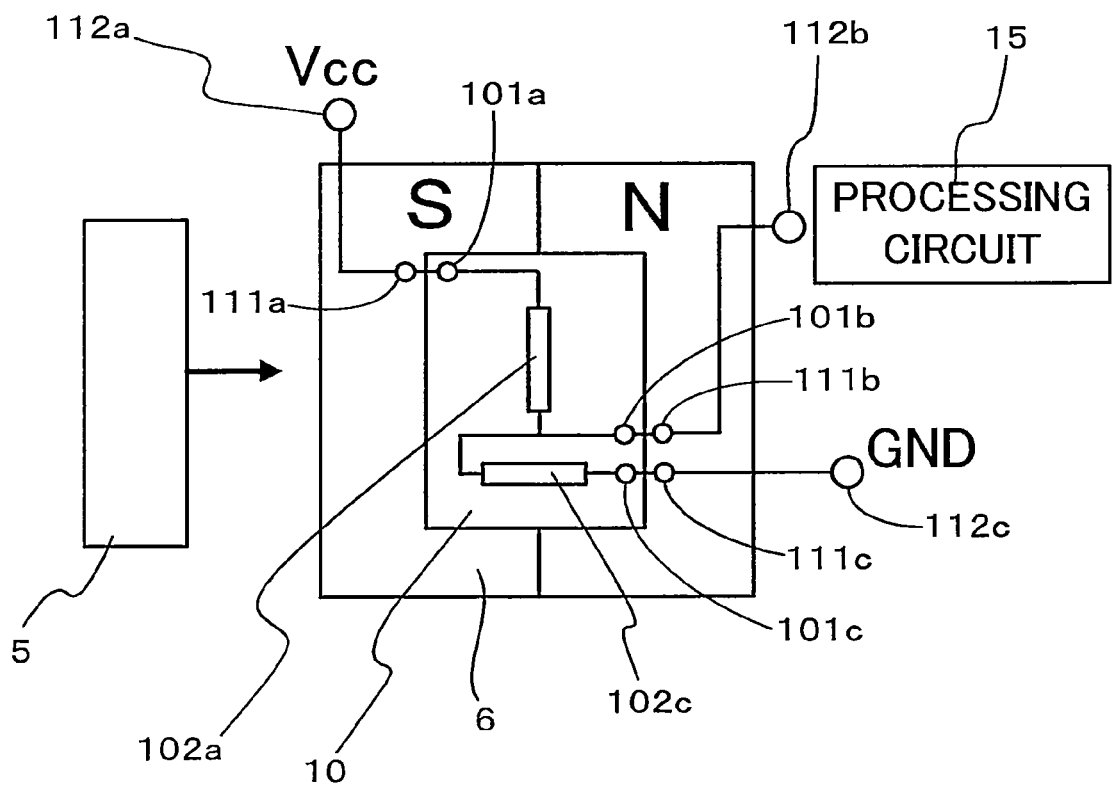
FIG. 12 is a schematic view illustrating the connected state of the AMR element and external circuitry of the magnetic sensor device of a second embodiment.

FIG. 11 is a top view illustrating the mounted state of an AMR element 10 when looking at the multi-layer substrate 9 side from the hollow section of the magnetic sensor device 202 of a second embodiment of the present invention. FIG. 12 is a schematic drawing illustrating the connected state between the AMR element 10 and external circuitry of the magnetic sensor device of a second embodiment of the present invention. In FIG. 11 and FIG. 12, the same reference numbers are given to component elements that are the same as those in FIG. 4, and explanations thereof are omitted. In FIG. 11, the resistor pattern 102*a* of the AMR element 10 is arranged such that the long side of rectangular pattern is in a direction orthogonal to the conveyance direction (X-axis direction), or in other words, is arranged so as to extend in the reading width direction (Y-axis direction). The resistor pattern 102*c* is arranged such that the long side of the rectangular shaped pattern extends in the conveyance direction (X-axis direction). The resistor pattern 102*a* and the resistor pattern 102*c* are such that end sections thereof are connected in series with each other. The connecting point of this series connection is connected with the electrode 101*b* of the AMR element 10. Moreover, the other electrode of the resistor pattern 102*a* is connected to the electrode 101*a*. The other end section of the resistor pattern 102*b* is connected to the electrode 101*c*.

In the magnetic sensor device 202, the electrode 101*a* is connected to the electrode 111*a* by metal wire 12, and is further connected to a direct-current power-supply voltage Vcc by way of an external pad 112*a*. The electrode 101*b* is connected to the electrode 111*b* by metal wire 12, and is further connected to a signal processing circuit 15 by way of an external pad 112*b*. The electrode 101*c* is connected to the electrode 111*c* by metal wire 12, and is further connected to direct-current ground (GND) by way of an external pad 112*c*.

In this second embodiment, as in the first embodiment, by applying a bias magnetic field in the X-axis direction, a bias magnetic field is applied to the resistor pattern 102*a*. However, the bias magnetic field is not in the magnetic sensitivity direction, so the magnetic field is not applied to the resistor pattern 102*c*. In this state, paper money 5 is conveyed in the magnetic sensitivity direction, and when the magnetic pattern of the paper money 5 is above the resistor pattern 102*a*, the magnetic field near the resistor pattern 102*a* changes. As a result, the resistance value of the resistor pattern 102*a* changes. On the other hand, as described above, even when the magnetic field near the resistor pattern 102*c* changes, that change is not sensed by the resistor pattern 102*c*, so that the resistance value of the resistor pattern 102*c* is always constant. The electric potential of the electrode 101*b* in this state changes when the magnetic pattern of the paper money 5 is above the AMR element 10, and does not change when the magnetic pattern of the paper money 5 is not above the AMR element 10. As a result, the AMR element 10 detects the existence of the magnetic pattern of the paper money 5 itself and not the edge of the magnetic pattern of the paper money 5.

In this second embodiment, by having the AMR element 10 detect the existence of the magnetic pattern of the paper money 5, it is possible to stably detect the magnetic pattern of the paper money without depending on the edge shape of the magnetic pattern of the paper money 5 and without being influenced by the effect of electromagnetic noise and the like. Moreover, it is possible to reduce the effect of exogenous noise, and stably obtain a detection signal for the magnetic pattern of the paper money 5.

As illustrated in FIG. 13, it is also possible to form the resistor pattern 102*a* into a meandering shape in which the long side extends in the reading width direction (Y-axis direction), and to form the resistor pattern 102*c* into a meandering shape in which the long side extends in the conveyance direction (X-axis direction). By doing so, it is possible to increase the resistance value of the resistor patterns 102*a*, 102*c* when compared with rectangular shaped resistor patterns 102*a*, 102*c*. Therefore, the detection sensitivity of the magnetic field of the AMR element 10 improves, and the detection sensitivity of the magnetic sensor device increases.

(Embodiment 3)

Figure 14:
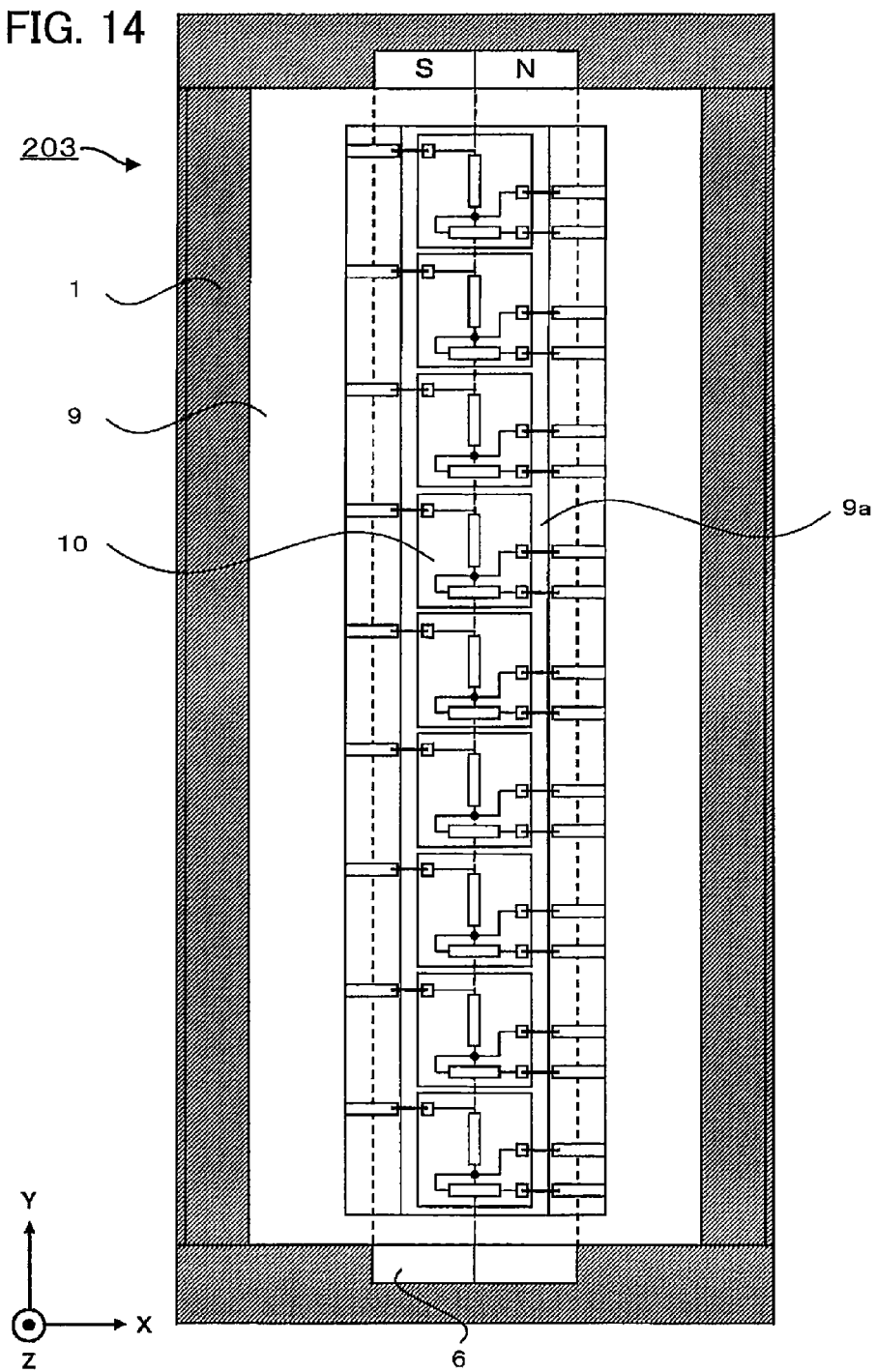
FIG. 14 is a top view illustrating the mounted state of an AMR element of a line type magnetic sensor device of a third embodiment of the present invention when looking at the multi-layered substrate side from the hollow section.

FIG. 14 is a top view that illustrates the mounted state of an AMR element 10 when looking at the multi-level substrate 9 side from the hollow section 2 of a line type magnetic sensor device 203 of a third embodiment of the present invention. In FIG. 14, the same reference numbers are used for component elements that are the same as in FIG. 11, and explanations thereof are omitted. In the line type magnetic sensor device 203 AMR elements 120 are mounted in a hole section 9*a* of a multi-layered substrate 9 in an array in a direction that is orthogonal to the conveyance direction (X-axis direction), or in other words, the reading width direction (Y-axis direction). The line type magnetic sensor device 203 performs operation similar to the magnetic sensor device 202 of the second embodiment. In the example in FIG. 14, the resistor patters 102*a*, 102*b* of the second embodiment illustrated in FIG. 11 are used as the resistor patterns of the AMR elements 10; however, it is also possible to use the resistor patterns 102*a*, 102*b* illustrated in FIG. 13, or the resistor patterns 102*a*, 102*b* of the first embodiment illustrated in FIG. 4 and FIG. 9.

In the third embodiment as described above, by arranging a plurality of AMR elements 10 in an array in the reading width direction, the detection width of the AMR elements 10 is expanded.

In the example in FIG. 14, all of the AMR elements 10 are stored in one hole section 9*a*; however, it is also possible to arrange a plurality of AMR elements 10 and multi-layered substrates 9 in an array in a direction (Y-axis direction) orthogonal to the conveyance direction (X-axis direction), and to store one AMR element 10 in the hole section 9*a* of one multi-layered substrate 9. In this case, each multi-layered substrate 9 outputs the change in resistance value from the electrode 101*b*, which is the output terminal of the AMR element 10, to the outside from the external pads 112*a* to 112*c*. Even in this case, the detection width of the AMR elements 10 is expanded.

(Embodiment 4)

Figure 15A:
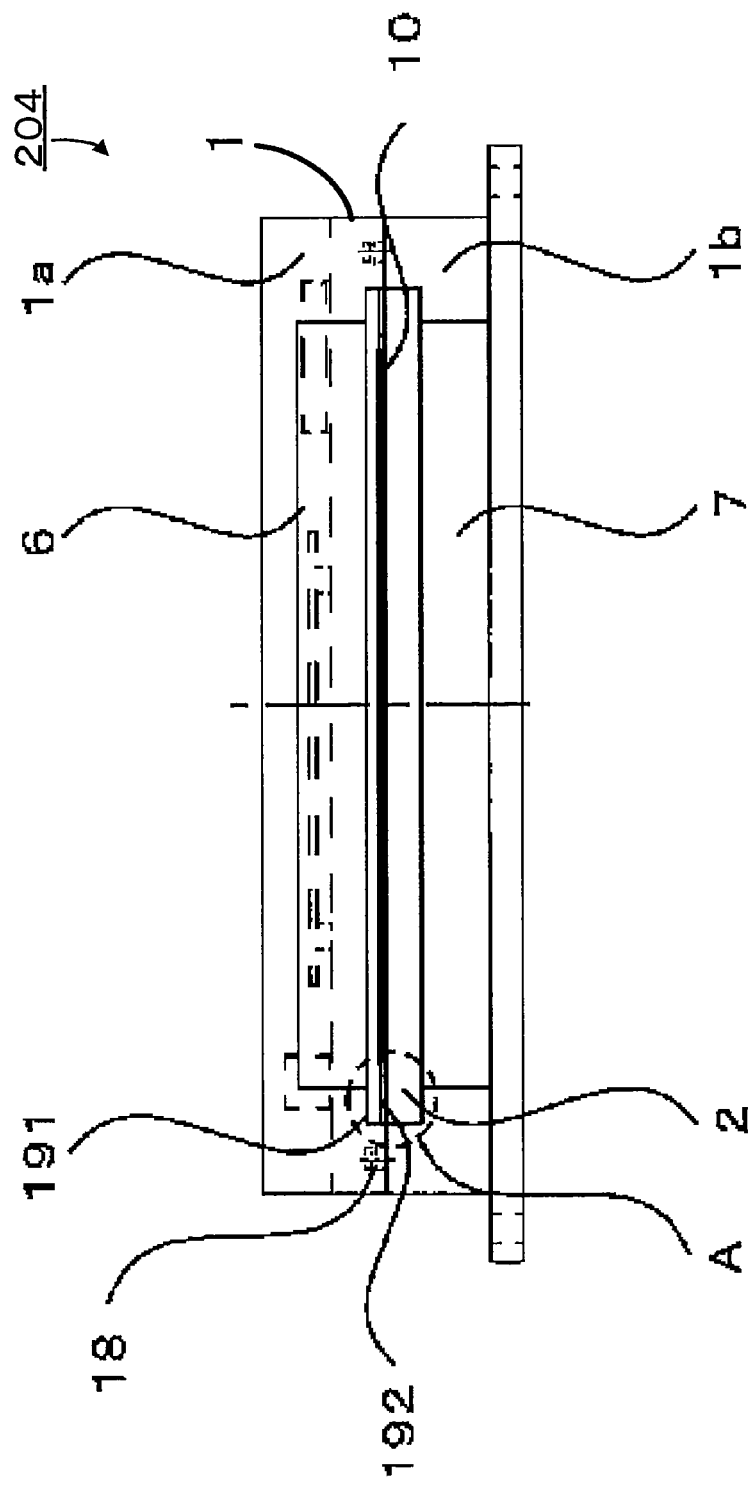
FIG. 15A is a front view illustrating the construction of line type magnetic sensor device of a fourth embodiment of the present invention.

FIG. 15A is a front view illustrating the construction of a line type magnetic sensor device 204 of a fourth embodiment of the present invention. FIG. 15B is an expanded diagram illustrating the construction of a line type magnetic sensor device 204 of a fourth embodiment of the present invention, and illustrates the area A in FIG. 15A. In FIG. 15A and FIG. 15B, the same reference numbers are used for component elements that are the same as those in FIG. 1, and explanations thereof are omitted. In the line type magnetic sensor device 204, a plurality of AMR elements 10 are mounted adjacent to each other in an array on the surface on hollow section side 2 of a metal carrier 191. The metal carrier 191 is formed using a non-magnetic metal such as aluminum having a small thermal resistance. Each AMR element 10 is adhered to the surface of the metal carrier 191 by an adhesive. A substrate 192 is adhered to the surface on the hollow section 2 side of the metal carrier 191 around the array of AMR elements 10. The substrate 192 is formed of resin such as glass epoxy. The surface of the AMR element 10 is sealed in a non-conductive resin 13 such as epoxy. The resin 13 coating is such that the resin does not go over the surface of the substrate 192. A first magnet 6 is provided on the other surface of the metal carrier 191.

A housing 1 is composed of a first housing 1*a* in which a first magnet 6 is placed, and a second housing 1*b* in which a second magnet 7 is placed. The first housing 1*a* and second housing 1*b* have construction so as to be able to be placed together with the hollow section 2 as a boundary. The metal carrier 191 is fastened to the first housing 1*a*. The first housing 1*a* and second housing 1*b* are positioned using fitting pins 18.

In the fourth embodiment as described above, the AMR elements 10 are mounted on the surface of a metal carrier 191 having small thermal resistance, so the heat of the AMR elements 10 is released as exhaust heat to the metal carrier 191 with good efficiency. Therefore, it is possible to keep the temperature of the AMR elements 10 from rising.

(Embodiment 5)

FIG. 16 is an enlarged view illustrating the construction of a line type magnetic sensor device of a fifth embodiment of the present invention, and illustrates a location that corresponds to area A in FIG. 15A. In FIG. 16, the same reference numbers are given to component elements that are the same as those in FIG. 15A and FIG. 15B, and explanations thereof are omitted. In the line type magnetic sensor device of this fifth embodiment, the entire surface and AMR elements 10 on the hollow section 2 side of the substrate 192 are sealed using resin 13. The entire surface of the hollow section 2 side of the resin 13 is covered with an electric shield plate 31. The electric shield plate 31 is formed using a non-magnetic metal such as aluminum.

In the fifth embodiment as described above, an electric shield plate 31 is placed between the hollow section 2, which is the conveyance path of the paper money 5, and the AMR elements 10, so that the AMR elements 10 are protected from static noise due to charge on the paper money 5, or from electrical noise due to devices located around the magnetic sensor device.

(Embodiment 6)

FIG. 17 is an enlarged view that illustrates the construction of a line type magnetic sensor device of a sixth embodiment of the present invention, and illustrates the location that corresponds to the area A in FIG. 15A. In FIG. 17, the same reference numbers are given to component elements that are the same as those in FIGS. 15A, 15B, and explanations thereof are omitted. In the line type magnetic sensor device of this sixth embodiment, as in the fifth embodiment, the entire surface of the hollow section 2 side of the substrate 192 and the AMR elements 10 are sealed using resin 13. The entire surface on the hollow section 2 side of the resin 13 is covered by a maintenance plate 32. The maintenance plate 32 is formed using resin or a non-magnetic metal. The maintenance plate 32 is such that both ends in the array direction of the AMR elements 10 are fastened to the metal carrier 191 or the first housing 1a. This fastening is performed using screws or the like, and the maintenance plate 32 is such that it can be attached to or removed from the metal carrier 191 or the first housing 1a.

With the construction described above, magnetic foreign matter that gets into the hollow section 2 is attracted to the first magnet 6 side and adheres to the surface of the maintenance plate 32. When foreign matter has adhered to the surface of the maintenance plate 32, the first housing 1a and second housing 1b are separated, after which the screws used to fasten the maintenance plate 32 are removed. The maintenance plate 32 is then cleaned or replaced to remove the foreign matter from inside the hollow section 2.

In this sixth embodiment, by using a maintenance plate 32, it is possible to remove all together any foreign matter that has gotten inside the hollow section 2. Therefore, cleaning the hollow section 2 is easy.

By providing a maintenance plate 32 on the surface of the hollow section 2 side of the second housing 1b, it is possible to obtain the effect described above even more. Moreover, when forming the maintenance plate 32 using a non-magnetic metal such as aluminum, the effect of embodiment 5 is also obtained.

(Embodiment 7)

Figure 18A:
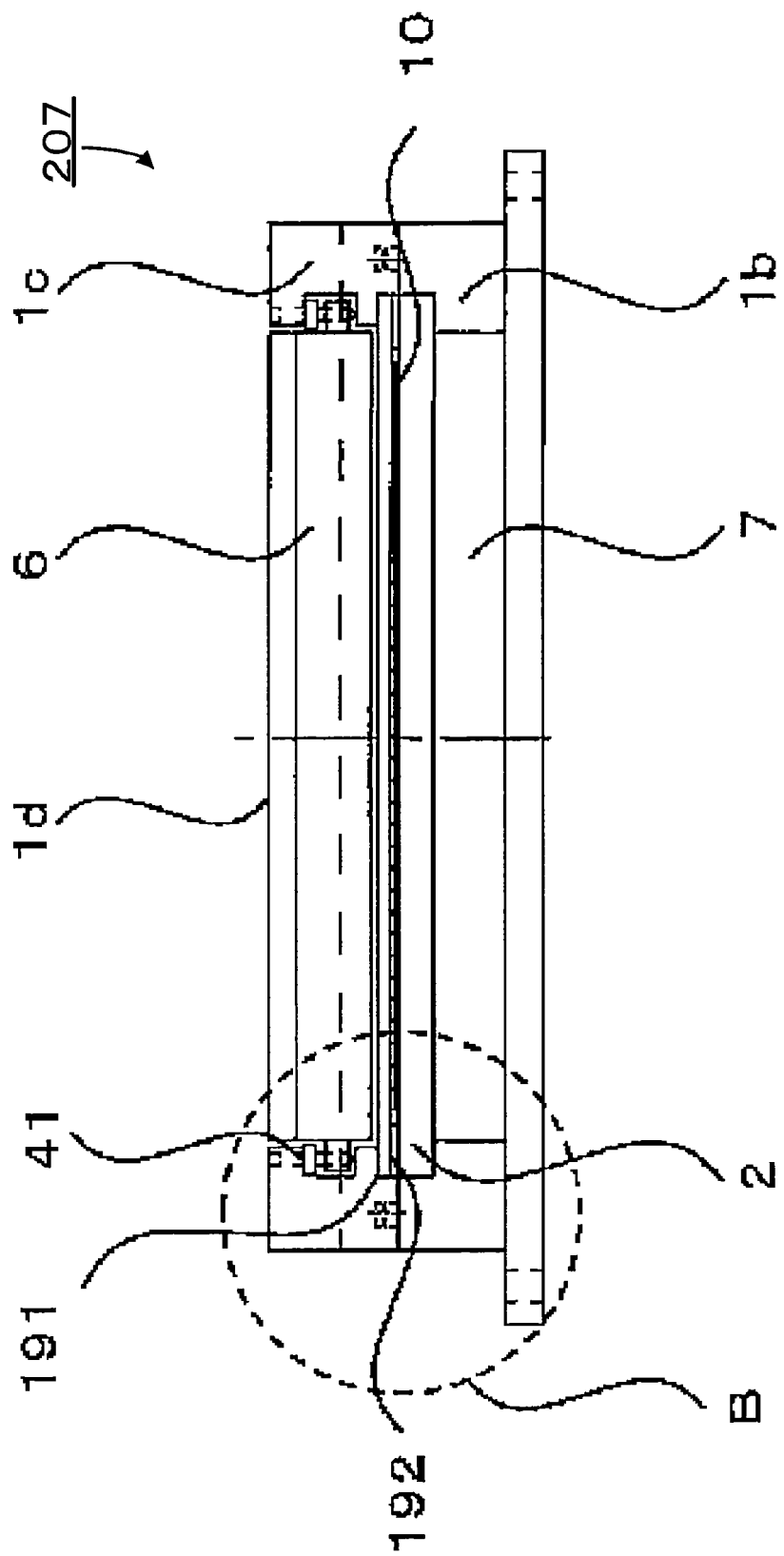
FIG. 18A is a front view illustrating the construction of a line type magnetic sensor device of a seventh embodiment of the present invention.

FIG. 18A is a front view illustrating construction of a line type magnetic sensor device 207 of a seventh embodiment of the present invention. FIG. 18B is an enlarged view illustrating the construction of a line type magnetic sensor device 207, and illustrates area B in FIG. 18A. In FIG. 18A and FIG. 18B, the same reference numbers are given to component elements that are the same as in FIG. 15A and FIG. 15B, and explanations thereof are omitted. In the line type magnetic sensor device 207 of this seventh embodiment, a first housing 1a is composed of a support block 1d that supports a first magnet 6, and a fitting block 1c that supports the support block 1d and fits with a second housing 1b. The support block 1d is fastened to the fitting block 1c by way of an adjuster 41 so as to be able to move in the up-down direction.

In this seventh embodiment, by the moving the support block 1d in the up-down direction, it is possible to adjust the space between the first magnet 6 and the second magnet 7. Therefore, it is possible to adjust dispersion of the magnetic field due to assembly tolerances, and it is possible to adjust the space between the first magnet 6 and the second magnet 7 so that optimal output is obtained from the AMR elements 10.

(Embodiment 8)

Figure 19:
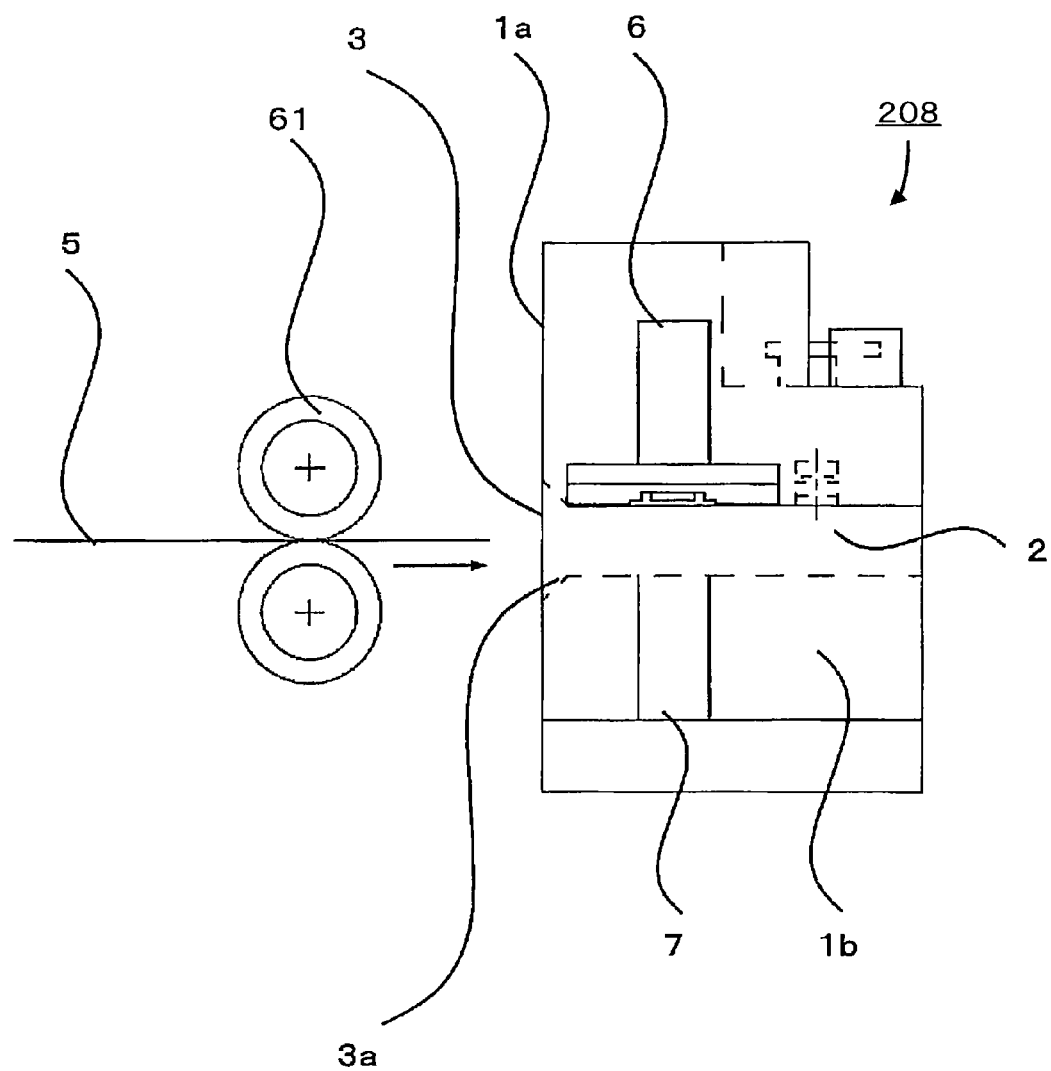
FIG. 19 is a front view illustrating the construction of a magnetic sensor device that includes a conveyance means of an eighth embodiment of the present invention.

FIG. 19 is a front view illustrating the construction of a magnetic sensor device 208, including a conveyance means, of an eighth embodiment of the present invention. In FIG. 19, the same reference numbers are given to component elements that are the same as in FIG. 1 and FIGS. 15A, 15B, and explanations thereof are omitted. In this magnetic sensor device 208, a tapered section 3a is formed in a first slit 3 so that the width in the up-down direction of the first slit 3 increases in the direction toward the outside. Conveyance rollers 61 as a conveyance method are composed of an upper and lower roller, and convey the paper money 5 at high speed to the first slit 3. The conveyance rollers 61 feed the paper money 5 so that the paper money 5 passes near the center in the up-down direction of the hollow section 2.

In embodiment 8, a tapered section 3a is formed in the first slit 3, so that the paper money 5 is smoothly conveyed from the first slit 3 to the hollow section 2.

Preferably, a magnetizing function is provided in the conveyance rollers 61. In this case, magnetized paper money 5 is conveyed to the magnetic sensor device 208, so that the detection sensitivity of the AMR element 10 is improved.

(Embodiment 9)

FIG. 20 is a cross-sectional drawing as seen from the conveyance direction of the test body (test object) of a magnetic sensor device 209 of a ninth embodiment of the present invention. In FIG. 20, the same reference numbers are given to component elements that are the same as those in FIG. 1, and explanations thereof are omitted. In this ninth embodiment, the AMR element 10 is located at a position shifted in the conveyance direction (X-axis direction) from the position illustrated in FIG. 1 (position on the boundary line between the N pole and S pole).

Figure 21:
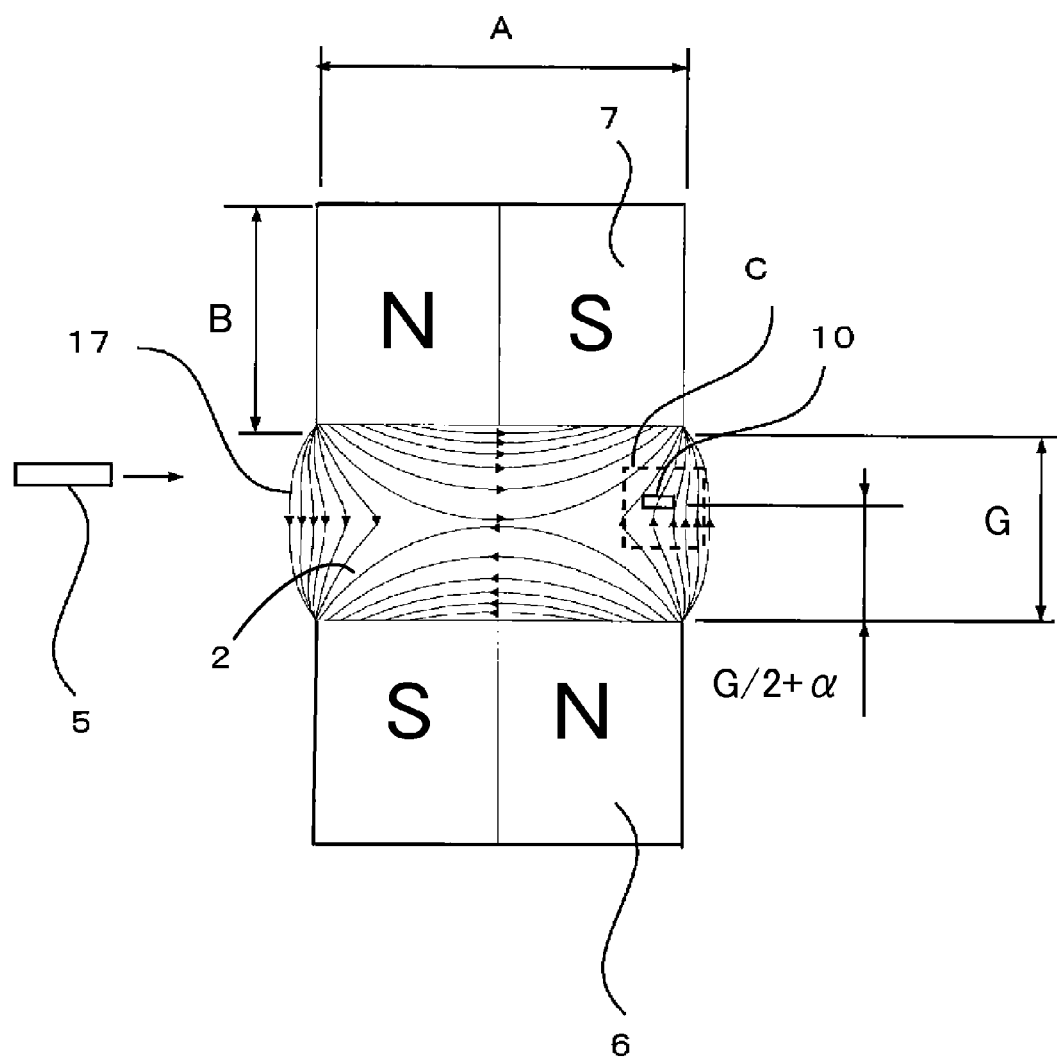
FIG. 21 is a schematic drawing illustrating the magnetic field distribution in the conveyance direction that is generated from a first magnet and a second magnet, and in the direction facing the first magnet and second magnet.
Figure 22A:
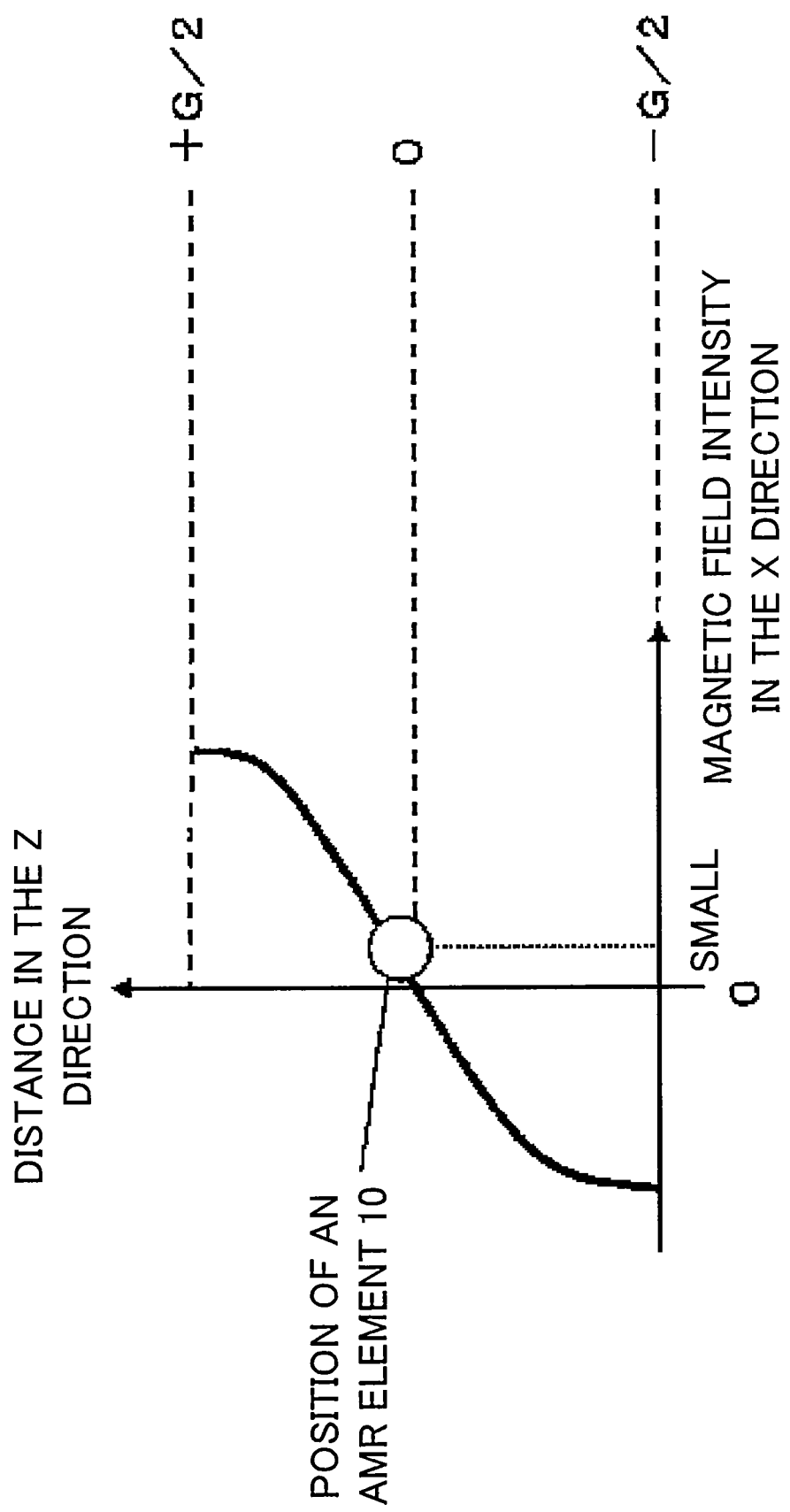
FIG. 22A is a graph illustrating the change in intensity of the magnetic field in the X-axis direction and Z-axis direction in FIG. 21, and illustrates the change in intensity in the opposing direction (Z-axis direction) of the magnetic field in the conveyance direction (X-axis direction)
Figure 23B:
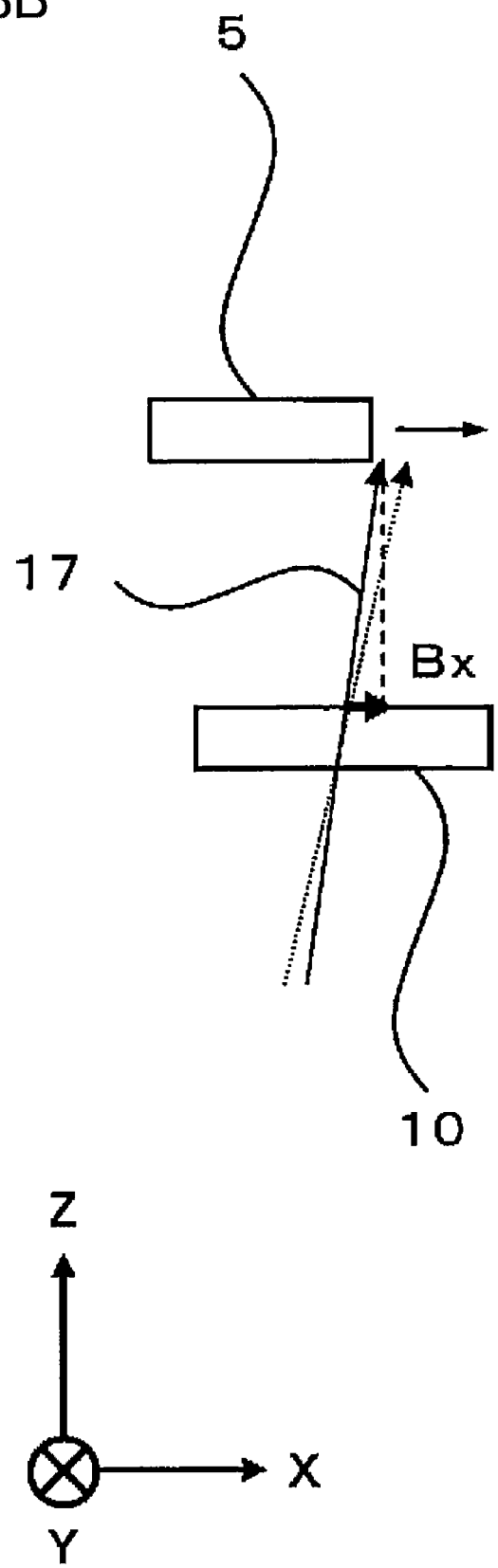
FIG. 23B is a vector diagram of magnetic force lines for explaining the detection principle of the magnetic sensor device of a ninth embodiment.

FIG. 21 is a schematic drawing illustrating the magnetic field distribution in the conveyance direction (X-axis direction) of the paper money 5 that is generated from the first magnet 6 and second magnet 7 of the ninth embodiment, and in the opposing direction (Z-axis direction) of the first magnet 6 and second magnet 7. FIG. 22A and FIG. 22B are graphs that illustrate the change in intensity of the magnetic field in the X-axis direction and Z-axis direction in FIG. 21. FIG. 22A is a graph illustrating the change in intensity in the opposing direction (Z-axis direction) of the magnetic field in the conveyance direction (X-axis direction), and FIG. 22B is a graph illustrating the change in intensity in the conveyance direction (X-axis direction) of the magnetic field in the opposing direction (Z-axis direction). FIG. 23A, FIG. 23B and FIG. 23C are vector diagrams of magnetic force lines for explaining the detection theory of the magnetic sensor device 209 of the ninth embodiment, and is an expanded view of area C in FIG. 21. FIG. 21 and FIGS. 23A to 23C illustrate the component elements from among the component elements illustrated in FIG. 20 necessary for explaining the magnetic distribution, and omit the others.

In this ninth embodiment, by locating the first magnet 6 and second magnet 7 on the conveyance path of the paper money 5 so as to oppose a different magnetic pole, as illustrated in FIG. 22A and FIG. 22B, in the hollow section 2, a gradient magnetic field that includes a zero point is formed for both the magnetic field component in the direction (Z-axis direction) opposing the first magnet 6 and second magnet 7 and the magnetic field component in the conveyance direction (X-axis direction).

The AMR element 10 is provided in an area with weak magnetic field intensity, which is where the magnetic field intensity of the gradient magnetic field in the conveyance direction (X-axis direction) is near zero. The paper money 5 passes through an area having a strong magnetic field intensity of a gradient magnetic field having a magnetic field intensity that is stronger than the area having the weak magnetic field intensity. More specifically, the AMR element 10 is provided in an area where, together with the magnetic field component in the conveyance direction (X-axis direction) of the gradient magnetic field being near zero, the magnetic field component of the gradient magnetic field in the opposing direction (Z-axis direction) of the first magnet 6 and second magnet 7 has strong magnetic field intensity. The paper money 5 passes through the area where the magnetic field component in the opposing direction of the gradient magnetic field has strong magnetic field intensity. The magnetic field intensity of the area with a strong magnetic field intensity is not less than 100 mT and not greater than 400 mT, for example.

In the magnetic sensor device 209 having the construction described above, as illustrated in FIG. 21, the magnetic force lines 17 in the area where the AMR element 10 is located face from the N pole of the first magnet 6 toward the S pole of the second magnet 7. As illustrated in FIG. 23A, the magnetic force lines 17 are inclined just a little from the opposing direction (Z-axis direction) toward the conveyance direction (X-axis direction), so that the X component acts as a bias magnetic field of the AMR element 10.

When the paper money 5 approaches near the AMR element 10, as illustrated in FIG. 23B, by the magnetic force lines 17 sloping toward the paper money 5 side, the magnetic field in the conveyance direction (X-axis direction) decreases. On the other hand, when the paper money 5 moves away from the AMR element 10, as illustrated in FIG. 23C, by the magnetic force lines 17 sloping toward the paper money 5 side, the magnetic field in the conveyance direction (X-axis direction) increases. By the component in the X-axis direction of the magnetic field changing in this way, the resistance value of the AMR element 10 changes according to the position of the paper money 5, and so the paper money 5 can be detected by this change.

With the ninth embodiment, the magnetic field that is applied to the AMR element 10 is such that the direction (Z-axis direction) facing the first magnet 6 and second magnet 7 is the main component, and the intensity in the conveyance direction (X-axis direction) of the magnetic field that is applied to the AMR element 10 does not change greatly due to the position in the opposing direction (Z-axis direction) of the AMR element 10. Therefore, the assembly precision is improved.

Moreover, by the main component of the magnetic field becoming the component in the opposing direction that AMR element 10 senses, it is possible to apply a large magnetic field in the opposing direction without having to take into consideration the saturation of the AMR element 10. Therefore, it is possible for a large magnetic field to be applied to the paper money 5 and to obtain stable output from the AMR element 10.

The magnetic sensor device 209 of this ninth embodiment can be used to form a line type magnetic sensor device in which AMR elements 10 are mounted in an array. In that case, each AMR element 10 is provided in an area where, together with the magnetic field component in the conveyance direction of the gradient magnetic field having an intensity near zero, the magnetic field component in the opposing direction of the gradient magnetic field has strong magnetic field intensity.

(Embodiment 10)

FIG. 24 is a cross-sectional drawing of a magnetic sensor device 210 of a tenth embodiment of the present invention as seen from the conveyance direction of a test body (test object). In FIG. 24 the same reference numbers are given to component elements that are the same as in FIG. 1, and explanations thereof are omitted. The magnetic sensor device 210 of the tenth embodiment, is such that in the construction of the first embodiment illustrated in FIG. 1, a first yoke 81 that is composed of a pair of magnetic bodies is newly provided on both side surfaces in the conveyance direction of the first magnet 6, and a second yoke 82 that is composed of a pair of magnetic bodies is newly provided on both side surfaces in the conveyance direction of the second magnet 7.

Figure 25:
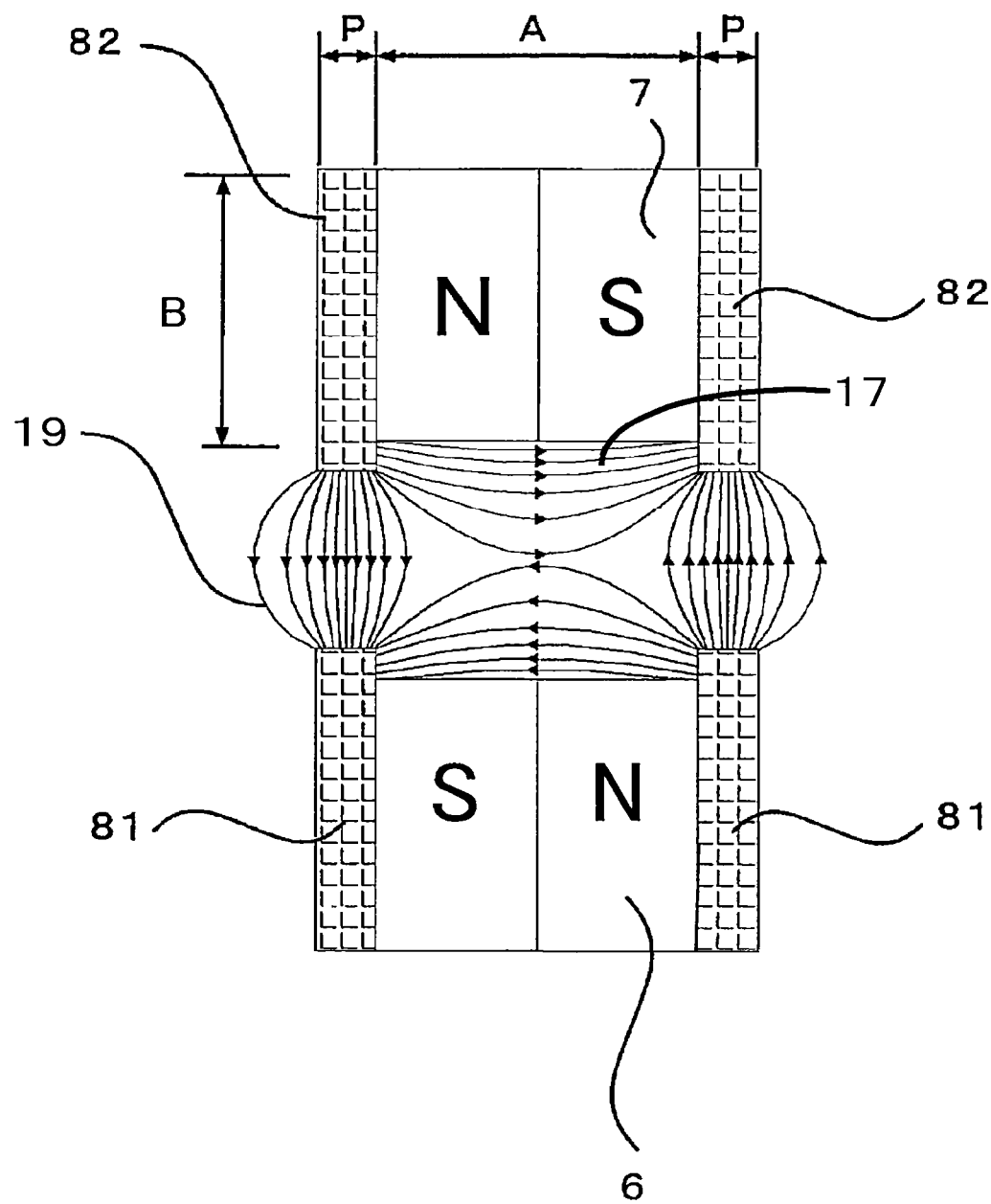
FIG. 25 is a schematic diagram illustrating the magnetic distribution in the conveyance direction (X-axis direction) and opposing direction (Z-axis direction) that is generated from a first magnet yoke and a second magnet yoke in a tenth embodiment.

FIG. 25 is a schematic drawing illustrating the magnetic field distributions in the conveyance direction (X-axis direction) and opposing direction (Z-axis direction) that are generated by the first magnet yoke 81 and the second magnet yoke 82 of this tenth embodiment. In FIG. 25 component elements from among the component elements illustrated in FIG. 24 that are necessary for explaining the magnetic field distributions are given, and the others are omitted.

Each magnetic body of the first magnet yoke 81 is a plate-shaped soft magnetic body having a specified thickness P (magnetic thickness B>P). The magnetic bodies of the first magnetic yoke 81 are such that the end sections on the top side in the opposing direction (Z-axis direction) have a fixed amount of overshoot from the end sections on the top side of the first magnet 6, and are installed on both sides of the first magnet 6. The magnetic bodies of the first magnetic yoke 81 may be installed on both sides of the first magnet 6 so that the first magnet 6 and the end sections on the top side in the opposing direction (Z-axis direction) are uniform.

Each magnetic body of the second magnet yoke 82 is a plate-shaped soft magnetic body having a specified thickness. The magnetic bodies of the second magnetic yoke 82 are such that the end sections on the bottom side in the opposing direction (Z-axis direction) have a fixed amount of overshoot from the end sections on the bottom side of the second magnet 7, and are installed on both sides of the second magnet 7. The magnetic bodies of the second magnetic yoke 82 may be installed on both sides of the second magnet 7 so that the second magnet 7 and the end sections on the bottom side in the opposing direction (Z-axis direction) are uniform.

Attachment of the first magnet yoke 81 to the first magnet 6, and attachment of the second magnet yoke 82 to the second magnet 7 is performed by a method such as adhesion, integrated molding, attraction by magnetic force or the like.

With this tenth embodiment, as illustrated in FIG. 25, the magnetic force lines 17 from the side surfaces of the first magnet 6 and second magnet 7 are concentrated in the yoke thickness P. Furthermore, there are magnetic force lines 19 from the yoke ends on the N pole sides of the first magnet 6 or second magnet 7. The magnetic force lines 19 trace a loop toward the yoke ends of the opposing S poles. Due to this phenomenon, when compared with the case when only the first magnet 6 and second magnet 7 are made to face each other (when there is no first magnet yoke 81 and second magnet yoke 82), it is possible to apply a large magnetic field to the paper money 5. As a result, stable output from the AMR element 10 is obtained.

Moreover, by installing the first magnet yoke 81 and the second magnet yoke 82 on both side surfaces of the first magnet 6 and second magnet 7, respectively, it is possible to make the magnetic force in the reading width direction (Y-axis direction) uniform. The magnetic sensor device 210 of this tenth embodiment can be formed into a line type magnetic sensor device in which AMR elements 10 are mounted in an array. As a result, it is possible to suppress fluctuation in the output between lines of AMR elements 10. Therefore, it is possible to improve yield and reduce manufacturing cost.

(Embodiment 11)

Figure 26:
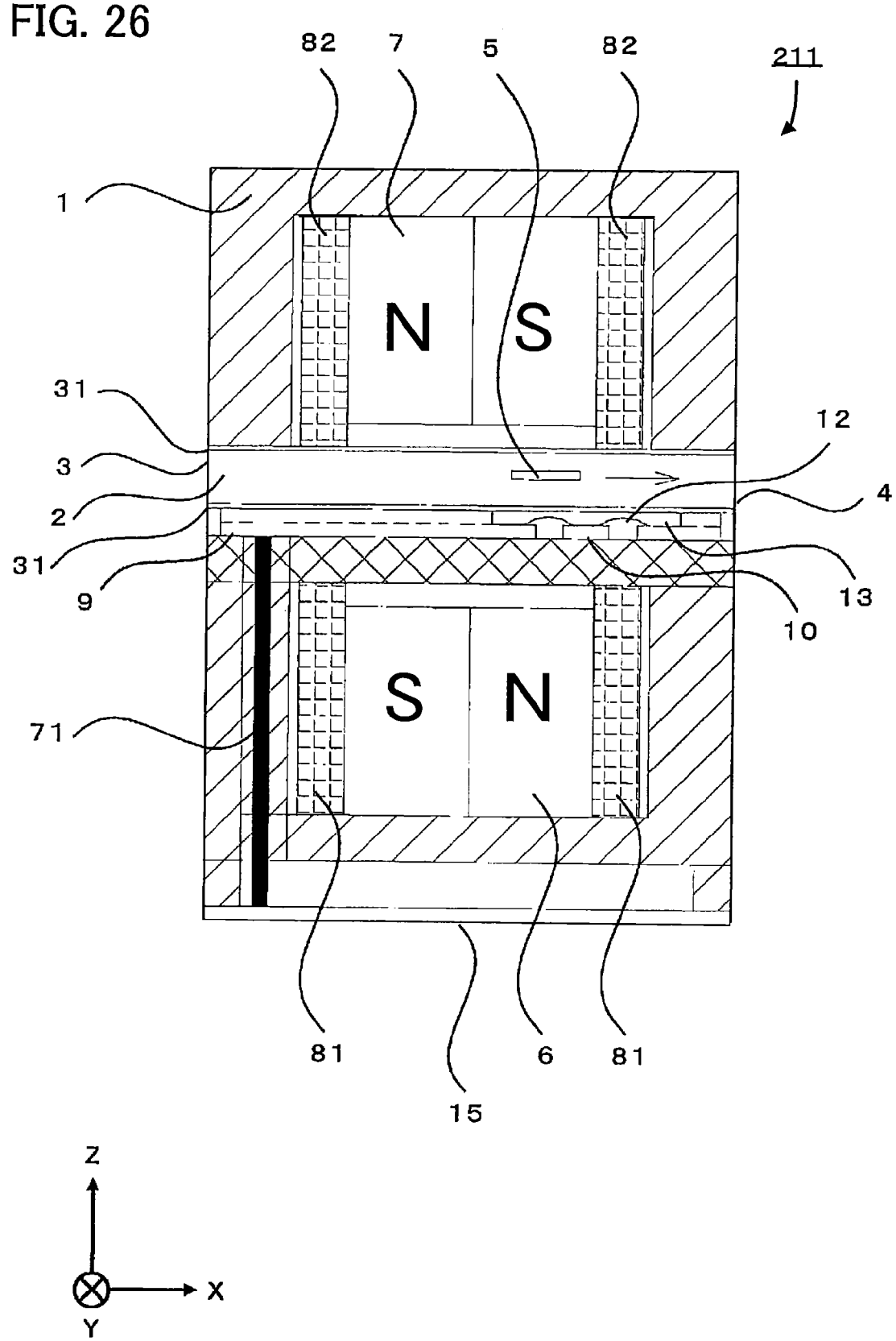
FIG. 26 is a cross-sectional drawing of a magnetic sensor device of an eleventh embodiment of the present invention as seen from the conveyance direction of the test body (test object).

FIG. 26 is a cross-sectional drawing of a magnetic sensor device 211 of an eleventh embodiment of the present invention as seen from the conveyance direction of the test body (test object). In FIG. 26, the same reference numbers are given to component elements that are the same as those in FIG. 20, and explanations thereof are omitted. In this eleventh embodiment, a first yoke 81 that is composed of a pair of magnetic bodies is newly provided on both side surfaces in the conveyance direction of the first magnet 6 of the construction of the ninth embodiment illustrated in FIG. 20, and a second yoke 82 that is composed of a pair of magnetic bodies is newly provided on both side surfaces in the conveyance direction of the second magnet 7.

With this eleventh embodiment, as in the tenth embodiment, it is possible to obtain stable output of the AMR element 10. Moreover, the magnetic sensor device 211 of this eleventh embodiment as well can be formed into a line type magnetic sensor in which AMR elements 10 are mounted in an array. In doing so, an effect of suppressing fluctuation in the output between lines is obtained.

All points of the disclosed embodiments are examples and should not be considered as being restrictive. The range of the present invention is not according to the explanation above, but is as disclosed in the claims, and it is intended that all changes that are within an equivalent meaning as that of the claims of the invention be included.

This application is based on Japanese Patent Application No. 2010-172367 filed on Jul. 30, 2010, Japanese Patent Application No. 2010-256025 filed on Nov. 16, 2010, and Japanese Patent Application No. 2011-109627 filed on May 5, 2011. The entire disclosures of Japanese Patent Application No. 2010-172367, Japanese Patent Application No. 2010-256025 and Japanese Patent Application No. 2011-109627 are incorporated herein by reference.

DESCRIPTION OF REFERENCE NUMERALS

1 Housing
1*a* First housing
1*b* Second housing
1*c* Fitting block
1*d* Support block
1*u* Upper housing
1*s* Lower housing
2 Hollow section
3 First slit
3*a* Tapered section
4 Second slit
5 Paper money (test object)
6 First magnet
7 Second magnet
9 Multi-layered substrate
9*a* Hole section in the multi-layered substrate
10 AMR element (Anisotropic MagnetoResistive element)
11 Conveyance path
12 Metal wire (method of electrical connection)
13 Resin
15 Processing circuit
17, 19 Magnetic force lines
18 Fitting pin
31 Electric shield plate
32 Maintenance plate
41 Adjuster
61 Conveyance roller
81 First magnet yoke
82 Second magnet yoke
91 First substrate layer
91*a* Hole section in the first substrate layer
92 Second substrate layer
92*a* Hole section in the second substrate layer
93 Third substrate layer
101*a*, 101*b*, 101*c* AMR element electrode
102*a*, 102*b*, 102*c* Resistor pattern
111*s*, 111*b*, 111*c* Conveyance path electrode
112*a*, 112*b*, 112*c* Conveyance path external pad
191 Metal carrier
192 Substrate
201, 202, 208, 209, 210, 211 Magnetic sensor device
203, 204, 207 Line type magnetic sensor device

The invention claimed is:

1. A magnetic sensor device, comprising:
a housing that includes a first slit, which is an insert opening for a test object, a hollow section, which is a conveyance path for the test object that has been inserted through the first slit, and a second slit, which is an output opening for the test object that was conveyed through the hollow section;
a first magnet that is provided in the hollow section and that is arranged such that magnetic poles thereof alternate along a conveyance direction of the test object;
a second magnet that is provided in the hollow section in a position that faces the first magnet on an opposite side of the conveyance path, and having magnetic poles arranged along the conveyance direction in an opposite polarity to the magnetic poles of the first magnet, the first and second magnets forming a continuous gradient magnetic field along the conveyance direction;
a magnetoresistive element provided between the test object and the first magnet and that has an output terminal, the magnetoresistive element being configured to change a resistance value thereof based on a magnetic component of the test object that passes through the gradient magnetic field;
a substrate that encloses the magnetoresistive element and outputs the change in resistance value from the output terminal of the magnetoresistive element; and
an electrical connector that electrically connects a pad of the substrate and the output terminal of the magnetoresistive element;
wherein
the magnetoresistive element is provided in an area where the magnetic field intensity is weak, which is where the magnetic field intensity in the gradient magnetic field is near zero; and
the test object passes through an area where the magnetic field intensity of the gradient magnetic field is stronger than the area where the magnetic field intensity is weak.

2. The magnetic sensor device according to claim 1, further comprising resin that covers the magnetoresistive element and electrical connector so as not to protrude from a surface of the substrate.

3. The magnetic sensor device according to claim 1, wherein
the magnetoresistive element is such that a first rectangular-shaped resistor pattern and a second rectangular-shaped resistor pattern each having one side located in a direction parallel to the conveyance direction are connected in series, and
a connection point between the first rectangular-shaped resistor pattern and the second rectangular-shaped resistor pattern that are connected in series is connected to the output terminal.

4. The magnetic sensor device according to claim 3, wherein
the first resistor pattern is arranged such that a long side of the rectangular shape extends in a direction that is orthogonal to conveyance direction, and
the second resistor pattern is arranged such that a long side of the rectangular shape extends in the conveyance direction.

5. The magnetic sensor device according to claim 3, wherein
the first resistor pattern and the second resistor pattern both have a meandering shape.

6. The magnetic sensor device according to claim 1, wherein
a plurality of magnetoresistive elements and substrates are arranged in an array in a direction that is orthogonal to the conveyance direction; and
each substrate outputs a change in resistance value from an output terminal of a respective magnetoresistive element.

7. The magnetic sensor device according to claim 1, wherein
a first yoke that includes a pair of magnetic bodies is provided on both side surfaces in the conveyance direction of the first magnet; and
a second yoke that includes a pair of magnetic bodies is provided on both side surfaces in the conveyance direction of the second magnet.

8. A magnetic sensor device, comprising:
a housing that includes a first slit, which is an insert opening for a test object, a hollow section, which is a conveyance path for the test object that has been inserted through the first slit, and a second slit, which is an output opening for the test object that was conveyed through the hollow section;
a first magnet that is provided in the hollow section and that is arranged such that magnetic poles thereof alternate along a conveyance direction of the test object;
a second magnet that is provided in the hollow section in a position that faces the first magnet on an opposite side of the conveyance path, and having magnetic poles arranged along the conveyance direction in an opposite polarity to the magnetic poles of the first magnet, the first and second magnets forming a gradient magnetic field, wherein the magnetic field component in the opposing direction to the first magnet and the magnetic field component in the conveyance direction both include a zero point;
a magnetoresistive element provided between the test object and the first magnet and that has an output terminal, the magnetoresistive element being configured to change a resistance value thereof based on a magnetic component of the test object that passes through the gradient magnetic field;
a substrate that encloses the magnetoresistive element and outputs the change in resistance value from the output terminal of the magnetoresistive element; and
an electrical connector that electrically connects a pad of the substrate and the output terminal of the magnetoresistive element;
wherein
the magnetoresistive element is provided in an area where magnetic field intensity is weak, which is where the magnetic field intensity in the conveyance direction of the gradient magnetic field is near zero; and
the test object passes through an area where the magnetic field intensity of the gradient magnetic field is stronger than the area where the magnetic field intensity is weak.

9. The magnetic sensor device according to claim 8, further comprising resin that covers the magnetoresistive element and electrical connector so as not protrude from a surface of the substrate.

10. The magnetic sensor device according to claim 8, wherein
the magnetoresistive element is such that a first rectangular-shaped resistor pattern and a second rectangular-shaped resistor pattern each having one side located in a direction parallel to the conveyance direction and are connected in series, and
a connection point between the first rectangular-shaped resistor pattern and the second rectangular-shaped resistor pattern that are connected in series is connected to the output terminal.

11. The magnetic sensor device according to claim 10, wherein
a first of the two resistive elements is arranged such that a length thereof extends in a direction that is orthogonal to conveyance direction, and
a second of the two resistive elements is arranged such that a length thereof extends in the conveyance direction.

12. The magnetic sensor device according to claim 10, wherein
the two resistive elements are patterns that have a meandering shape.

13. A magnetic sensor device, comprising:
a housing that includes a first slit, which is an insert opening for a test object, a hollow section, which is a conveyance path for the test object that has been inserted through the first slit, and a second slit, which is an output opening for the test object that was conveyed through the hollow section;
a first magnet that is provided in the hollow section and that is arranged such that magnetic poles thereof alternate along a conveyance direction of the test object;
a second magnet that is provided in the hollow section in a position that faces the first magnet on an opposite side of the conveyance path, and having magnetic poles arranged along the conveyance direction in an opposite polarity to the magnetic poles of the first magnet, the first and second magnets forming a gradient magnetic field, wherein the magnetic field component in the opposing direction to the first magnet and the magnetic field component in the conveyance direction both include a zero point;
a magnetoresistive element provided between the test object and the first magnet and that has an output terminal, the magnetoresistive element being configured to change a resistance value thereof based on a magnetic component of the test object that passes through the gradient magnetic field;
a substrate that encloses the magnetoresistive element and outputs the change in resistance value from the output terminal of the magnetoresistive element; and
an electrical connector that electrically connects a pad of the substrate and the output terminal of the magnetoresistive element;
wherein
the magnetoresistive element is provided in an area where, together with intensity of the magnetic field component in the conveyance direction of the gradient magnetic field being near zero, the intensity of the magnetic field component in the opposing direction of the gradient magnetic field is stronger than in other areas; and
the test object passes through an area where the intensity of the magnetic field component in the opposing direction of the gradient magnetic field is stronger than in other areas.

14. The magnetic sensor device according to claim 13, further comprising resin that covers the magnetoresistive element and electrical connector so as not protrude from a surface of the substrate.

15. The magnetic sensor device according to claim 13, wherein
the magnetoresistive element is such that a first rectangular-shaped resistor pattern and a second rectangular-shaped resistor pattern each having one side located in a direction parallel to the conveyance direction and are connected in series, and
a connection point between the first rectangular-shaped resistor pattern and the second rectangular-shaped resistor pattern that are connected in series is connected to the output terminal.

16. The magnetic sensor device according to claim 15, wherein
the first resistor pattern is arranged such that a long side of the rectangular shape extends in a direction that is orthogonal to conveyance direction, and
the second resistor pattern is arranged such that a long side of the rectangular shape extends in the conveyance direction.

17. The magnetic sensor device according to claim 15, wherein
the first resistor pattern and the second resistor pattern both have a meandering shape.

18. A magnetic sensor device, comprising:
a housing that includes a first slit, which is an insert opening for a test object, a hollow section, which is a conveyance path for the test object that has been inserted through the first slit, and a second slit, which is an output opening for the test object that was conveyed through the hollow section;
a first magnet that is provided in the hollow section and that is arranged such that magnetic poles thereof alternate along a conveyance direction of the test object;
a second magnet that is provided in the hollow section in a position that faces the first magnet on an opposite side of the conveyance path, and having magnetic poles arranged along the conveyance direction in an opposite polarity to the magnetic poles of the first magnet, the first and second magnets forming a continuous gradient magnetic field in the conveyance direction;
a plurality of magnetoresistive elements provided in an array in a direction orthogonal to the conveyance direction between the test object and the first magnet and that have output terminals, and are such that the resistance values thereof change based on a magnetic component of the test object that passes through the gradient magnetic field;
a substrate that encloses the plurality of magnetoresistive elements all together and outputs change in resistance values from the output terminals of the plurality of magnetoresistive elements; and
an electrical connector that electrically connects pads of the substrate and the output terminals of the magnetoresistive elements;
wherein
the plurality of magnetoresistive elements are provided in an area where magnetic field intensity is weak, which is where the magnetic field intensity in the gradient magnetic field is near zero; and
the test object passes through an area where the magnetic field intensity of the gradient magnetic field is stronger than the area where the magnetic field intensity is weak.

19. A magnetic sensor device, comprising:
a housing that includes a first slit, which is an insert opening for a test object, a hollow section, which is a conveyance path for the test object that has been inserted through the first slit, and a second slit, which is an output opening for the test object that was conveyed through the hollow section;
a first magnet that is provided in the hollow section and that is arranged such that magnetic poles thereof alternate along a conveyance direction of the test object;
a second magnet that is provided in the hollow section in a position that faces the first magnet on an opposite side of the conveyance path, and having magnetic poles arranged along the conveyance direction in an opposite polarity to the magnetic poles of the first magnet, the first and second magnets forming a gradient magnetic field, wherein the magnetic field component in the opposing direction to the first magnet and the magnetic field component in the conveyance direction both include a zero point;
a plurality of magnetoresistive elements provided in an array in a direction orthogonal to the conveyance direction between the test object and the first magnet and that have output terminals, and are such that the resistance values thereof change based on a magnetic component of the test object that passes through the gradient magnetic field, each magnetoresistive element including two resistive elements having a length dimension longer than a width dimension and oriented to be symmetrical about a midline of the first and second magnets;
a substrate that encloses the plurality of magnetoresistive elements all together and outputs change in resistance values from the output terminals of the plurality of magnetoresistive elements; and
an electrical connector that electrically connects pads of the substrate and the output terminals of the magnetoresistive elements;
wherein
each of the magnetoresistive elements is provided in an area where, together with intensity of the magnetic field component in the conveyance direction of the gradient magnetic field being near zero, the intensity of the magnetic field component in the opposing direction of the gradient magnetic field is stronger than in other areas; and
the test object passes through an area where the intensity of the magnetic field component in the opposing direction of the gradient magnetic field is stronger than in the other areas.

* * * * *